US009989827B2

(12) United States Patent
Jeon et al.

(10) Patent No.: US 9,989,827 B2
(45) Date of Patent: Jun. 5, 2018

(54) DISPLAY DEVICE

(71) Applicant: Samsung Display Co., Ltd, Yongin-si, Gyeonggi-do (KR)

(72) Inventors: Young Jae Jeon, Asan-si (KR); Il You, Seongnam-si (KR); Seung Rae Kim, Cheonan-si (KR); Chun Yan Jin, Hwaseong-si (KR); Beom Soo Park, Hwaseong-si (KR); Jae Hyun Park, Yongin-si (KR); Sang Ju Lee, Seoul (KR); Hye Won Hyeon, Anseong-si (KR)

(73) Assignee: Samsung Display Co., Ltd. (KR)

( * ) Notice: Subject to any disclaimer, the term of this patent is extended or adjusted under 35 U.S.C. 154(b) by 0 days. days.

(21) Appl. No.: 15/412,930

(22) Filed: Jan. 23, 2017

(65) Prior Publication Data
US 2017/0357115 A1    Dec. 14, 2017

(30) Foreign Application Priority Data

Jun. 13, 2016    (KR) .......................... 10-2016-0072992

(51) Int. Cl.
| H01L 27/14 | (2006.01) |
| H01L 29/04 | (2006.01) |
| H01L 29/15 | (2006.01) |
| H01L 31/036 | (2006.01) |
| G02F 1/1368 | (2006.01) |
| G02F 1/1343 | (2006.01) |
| G02F 1/1362 | (2006.01) |
| H01L 27/12 | (2006.01) |

(Continued)

(52) U.S. Cl.
CPC ...... *G02F 1/1368* (2013.01); *G02F 1/134309* (2013.01); *G02F 1/136227* (2013.01); *G02F 1/136286* (2013.01); *H01L 27/1248* (2013.01); *H01L 29/41733* (2013.01); *H01L 29/41775* (2013.01); *H01L 29/42384* (2013.01); *H01L 29/78636* (2013.01); *H01L 29/78696* (2013.01); *G02F 2001/134318* (2013.01); *H01L 2029/42388* (2013.01)

(58) Field of Classification Search
CPC ............... H01L 27/124; H01L 27/1288; H01L 27/1248; H01L 27/1225; H01L 29/42384; H01L 29/66969
See application file for complete search history.

(56) References Cited

U.S. PATENT DOCUMENTS

| 2001/0000620 A1* | 5/2001 | Ishida .................... H01L 21/268 257/59 |
| 2016/0035750 A1 | 2/2016 | Jeon et al. |

(Continued)

*Primary Examiner* — Meiya Li
(74) *Attorney, Agent, or Firm* — Innovation Counsel LLP

(57) ABSTRACT

A display device is provided. The display device includes a base; a gate conductor disposed directly on the base and including a gate line and a gate electrode; a gate insulating layer disposed on the gate conductor and including an overlap portion, which overlaps with the gate conductor, and a non-overlap portion, which is connected to the overlap portion, does not overlap with the gate conductor, and is spaced apart from the base; and a semiconductor pattern disposed on the gate insulating layer and overlapping with the gate electrode, wherein edges of the gate insulating layer project further than edges of the gate conductor and edges of the semiconductor pattern.

28 Claims, 44 Drawing Sheets

(51) Int. Cl.
  *H01L 29/417* (2006.01)
  *H01L 29/423* (2006.01)
  *H01L 29/786* (2006.01)

(56) References Cited

U.S. PATENT DOCUMENTS

2016/0078957 A1  3/2016  Kim et al.
2016/0334657 A1  11/2016 Jeon et al.
2017/0062493 A1  3/2017  Jeon et al.

* cited by examiner

DISPLAY DEVICE

This application claims priority to Korean Patent Application No. 10-2016-0072992 filed on Jun. 13, 2016 in the Korean Intellectual Property Office, the disclosure of which is incorporated herein by reference in its entirety.

BACKGROUND

1. Field of the Invention

The present disclosure relates to a display device.

2. Description of the Related Art

A liquid crystal display (LCD) device, which is one of the most widely used flat panel display devices, applies a voltage to electrodes so as to realign liquid crystal molecules in a liquid crystal layer and thus adjust the amount of light transmitted therethrough. The LCD device may include field-generating electrodes such as a pixel electrode and a common electrode, and may also include a liquid crystal layer. The LCD device generates an electric field by applying voltages to the field-generating electrodes, and displays an image by controlling the alignment of liquid crystal molecules in the liquid crystal layer using the electric field.

In the LCD device, at least one of the pixel electrode and the common electrode includes a plurality of cutouts and a plurality of branch electrodes, which are defined by the cutouts.

In a case in which two different types of field-generating electrodes are provided in the LCD device, as mentioned above, different photomasks are needed to form the two different types of field-generating electrodes.

Also, the LCD device additionally needs multiple photomasks for forming a gate line and a data line on a substrate and for forming a thin-film transistor (TFT) connected to the gate line, the data line, and the pixel electrode. Thus, the manufacturing cost of the LCD device increases. In the meantime, the TFT may cause a leakage current due to light provided from therebelow, for example, light provided from a backlight unit, in which case, the display quality of the LCD device may deteriorate.

SUMMARY

Exemplary embodiments of the present disclosure provide a display device capable of preventing an increase in the manufacturing cost thereof.

Exemplary embodiments of the present disclosure also provide a display device capable of preventing a leakage current from being generated in a thin-film transistor (TFT).

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, there is provided a display device. The display device includes a base; a gate conductor disposed directly on the base and including a gate line and a gate electrode; a gate insulating layer disposed on the gate conductor and including an overlap portion, which overlaps with the gate conductor, and a non-overlap portion, which is connected to the overlap portion, does not overlap with the gate conductor, and is spaced apart from the base; and a semiconductor pattern disposed on the gate insulating layer and overlapping with the gate electrode, wherein edges of the gate insulating layer project further than edges of the gate conductor and edges of the semiconductor pattern.

The display device may have a shape of the edges of the gate insulating layer substantially the same as a shape of the edges of the gate conductor.

The display device may have the edges of the gate conductor project further than edges of the semiconductor pattern.

The display device may have a shape of the edges of the semiconductor pattern substantially the same as a shape of the edges of the gate electrode.

The display device may have the semiconductor pattern isolated from other parts in the same layer.

The display device may have the semiconductor pattern overlap with the gate conductor.

The display device may further include: a data conductor disposed on the base and including a data line, which is insulated from the gate line, a source electrode, which is connected to the data line and the semiconductor pattern, and a drain electrode, which is connected to the semiconductor pattern and is spaced apart from the source electrode; where the drain electrode includes a first portion, which is disposed on the base, does not overlap with the gate insulating layer, and is spaced apart from the gate electrode with a space provided therebetween, and a second portion, which is connected to the first portion and is disposed on the gate insulating layer.

The display device may have the first portion disposed directly on the base.

The display device may have the second portion include a first sub-portion, which overlaps with the non-overlap portion and does not overlap with the gate electrode and the semiconductor pattern, and a second sub-portion, which is connected to the first sub-portion, overlaps with the overlap portion and the gate electrode, and does not overlap with the semiconductor pattern.

The display device may have the second portion further include a third sub-portion, which is connected to the second sub-portion and overlaps with the gate electrode, the overlap portion, and the semiconductor pattern.

The display device may further include: a first passivation layer disposed on the source electrode, the drain electrode, and the semiconductor pattern; a first electrode disposed on the first passivation layer; a second passivation layer disposed on the first electrode; and a second electrode disposed on the second passivation layer.

The display device may have a thickness of the second electrode larger than a thickness of the first electrode.

The display device may have: the first passivation layer include a contact hole, which exposes part of the drain electrode; the first electrode include an electrode opening, which overlaps with the contact hole; the second passivation layer include a passivation opening, which overlaps with the electrode opening; the second electrode is connected to the drain electrode through the contact hole, the electrode opening, and the passivation opening; and a size of the passivation opening is smaller than a size of the electrode opening.

The display device may further include: an organic layer disposed between the first passivation layer and the second passivation layer; where the first electrode is disposed on the organic layer, and the contact hole is formed in the first passivation layer and the organic layer.

The display device may have: the data conductor further include a gate signal transmission pad portion, which is disposed on the base; the gate conductor further include a gate pad portion, which is disposed directly on the base and is connected to the gate line; and the gate signal transmission pad portion and the gate pad portion are electrically connected via a connecting member.

The display device may have: the gate insulating layer and the first passivation layer include a first pad contact hole, which exposes the gate pad portion; the first passivation layer includes a second pad contact hole, which exposes the gate signal transmission pad portion; and the connecting member is connected to the gate pad portion via the first pad contact hole and is connected to the gate signal transmission pad portion via the second pad contact hole.

The display device may have the connecting member include the same material as the first electrode.

The display device may further include: an insulating member disposed on the connecting member and comprising the same material as the second passivation layer, where edges of the insulating member project further than edges of the connecting member.

The display device may have: the data conductor further include a data pad portion, which is disposed on the base and is connected to the data line; the first passivation layer include a third pad contact hole, which exposes the data pad portion; and a contact assisting member, which is connected to the data pad portion, is disposed on the first passivation layer.

The display device may have the contact assisting member include the same material as the second electrode.

According to another exemplary embodiment of the present disclosure, there is provided a display device. The display device includes a base; a gate electrode disposed directly on the base; a gate insulating layer disposed on the gate electrode; a semiconductor pattern disposed on the gate insulating layer and overlapping with the gate electrode; a source electrode connected to the semiconductor pattern; and a drain electrode connected to the semiconductor pattern and spaced apart from the source electrode and the gate electrode, wherein the drain electrode includes a first portion, which is disposed on the base, does not overlap with the gate insulating layer, and is spaced apart from the gate electrode with a space provided therebetween, and a second portion, which is connected to the first portion and is disposed on the gate insulating layer.

The display device may have the first portion disposed directly on the base.

The display device may have the second portion include a first sub-portion, which overlaps with the non-overlap portion and does not overlap with the gate electrode and the semiconductor pattern, and a second sub-portion, which is connected to the first sub-portion, overlap with the overlap portion and the gate electrode, and does not overlap with the semiconductor pattern.

The display device may have the second portion further include a third sub-portion, which is connected to the second sub-portion and overlaps with the gate electrode, the overlap portion, and the semiconductor pattern.

The display device may have edges of the gate electrode project further than edges of the semiconductor pattern.

The display device may have a shape of the edges of the semiconductor pattern be substantially the same as a shape of the edges of the gate electrode.

The display device may have the semiconductor pattern isolated from other parts in the same layer.

The display device may have the semiconductor pattern overlap with the gate electrode.

According to the exemplary embodiments, a display device capable of preventing an increase in the manufacturing cost thereof may be provided.

Also, a display device capable of preventing a leakage current from being generated in a TFT may be provided.

Other features and aspects will be apparent from the following detailed description, the drawings, and the claims.

DETAILED DESCRIPTION OF THE EMBODIMENTS

Figure 1:
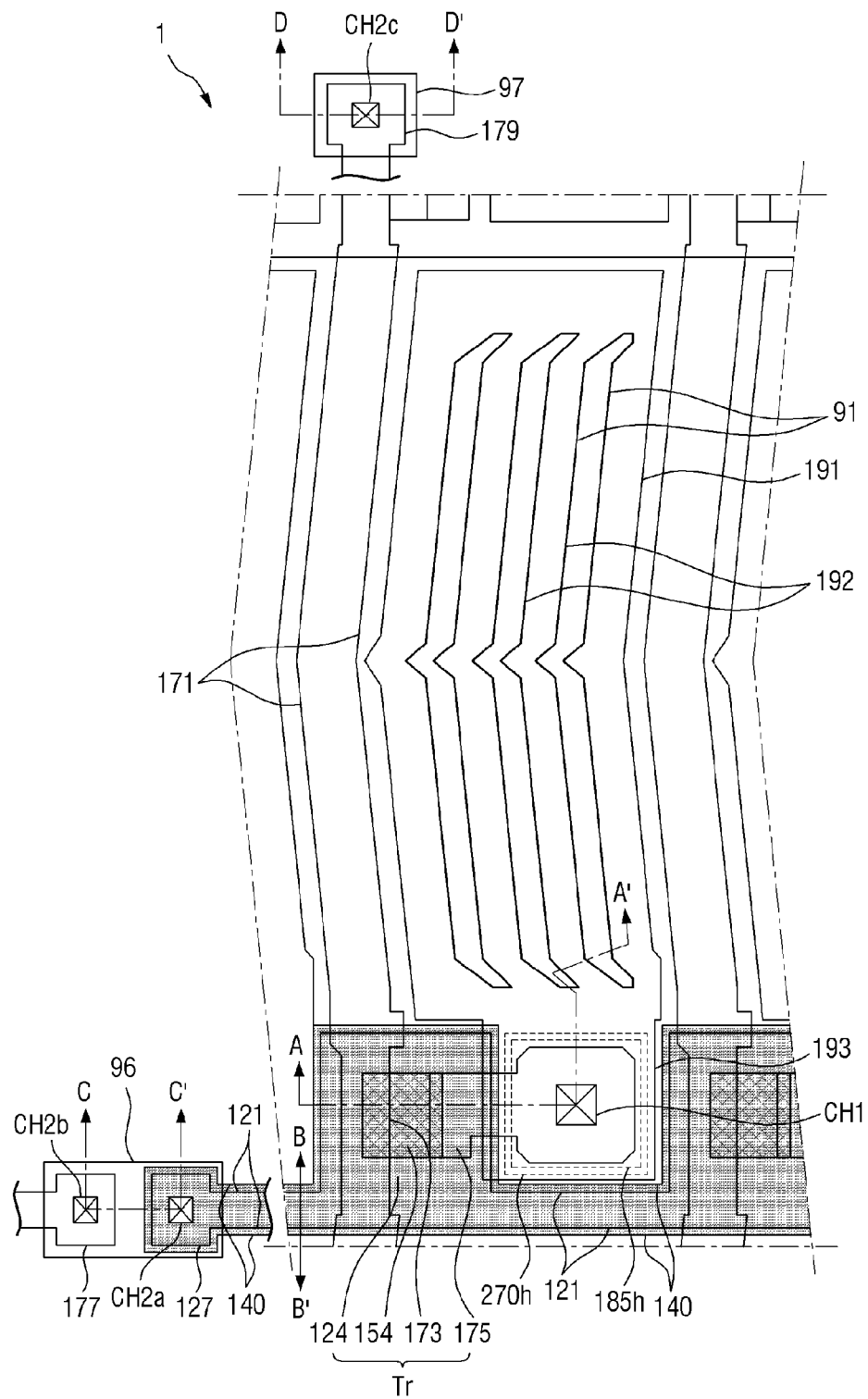
FIG. 1 is a schematic layout view of a display device according to an exemplary embodiment of the present disclosure.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Like reference characters are used throughout the specification to indicate like or similar elements.

Exemplary embodiments of the present disclosure will hereinafter be described, taking a plane-line switching (PLS)-type display device as an example, but the present disclosure is not limited thereto. That is, the present disclosure may also be applicable to various other display devices such as a vertical alignment (VA)-mode display device, a patterned vertical alignment (PVA)-mode display device, an in-plane switching (IPS) display device, a fringe-field switching (FFS) display device, a twisted nematic (TN) display device, and an electrically-controlled birefringence (ECB) display device that include elements set forth in the claims of the present disclosure.

Also, exemplary embodiments of the present disclosure will hereinafter be described, taking a display device having a common electrode-on-bottom configuration as an example, but the present disclosure is not limited thereto. That is, the present disclosure may also be applicable to a display device having a common electrode-on-top configuration as long as the display device includes the elements set forth in the claims of the present disclosure.

Exemplary embodiments of the present disclosure will hereinafter be described with reference to the accompanying drawings.

Figure 2:
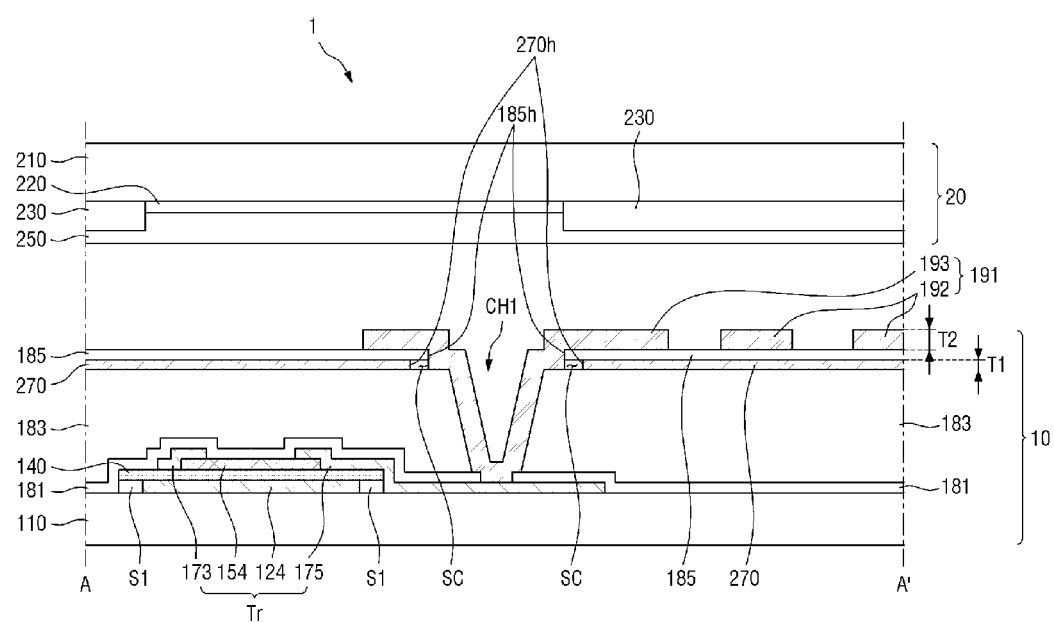
FIG. 2 is a cross-sectional view, taken along line A-A' of FIG. 1, of the display device according to the exemplary embodiment of FIG. 1.
Figure 3:
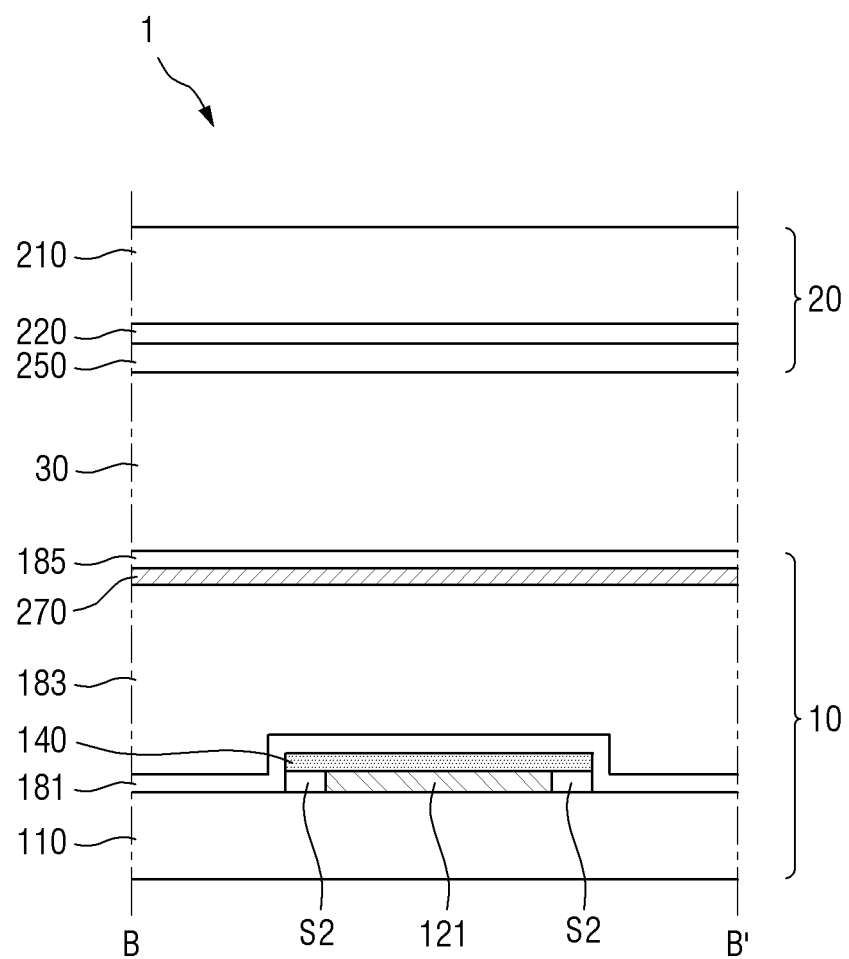
FIG. 3 is a cross-sectional view, taken along line B-B' of FIG. 1, of the display device according to the exemplary embodiment of FIG. 1.
Figure 4:
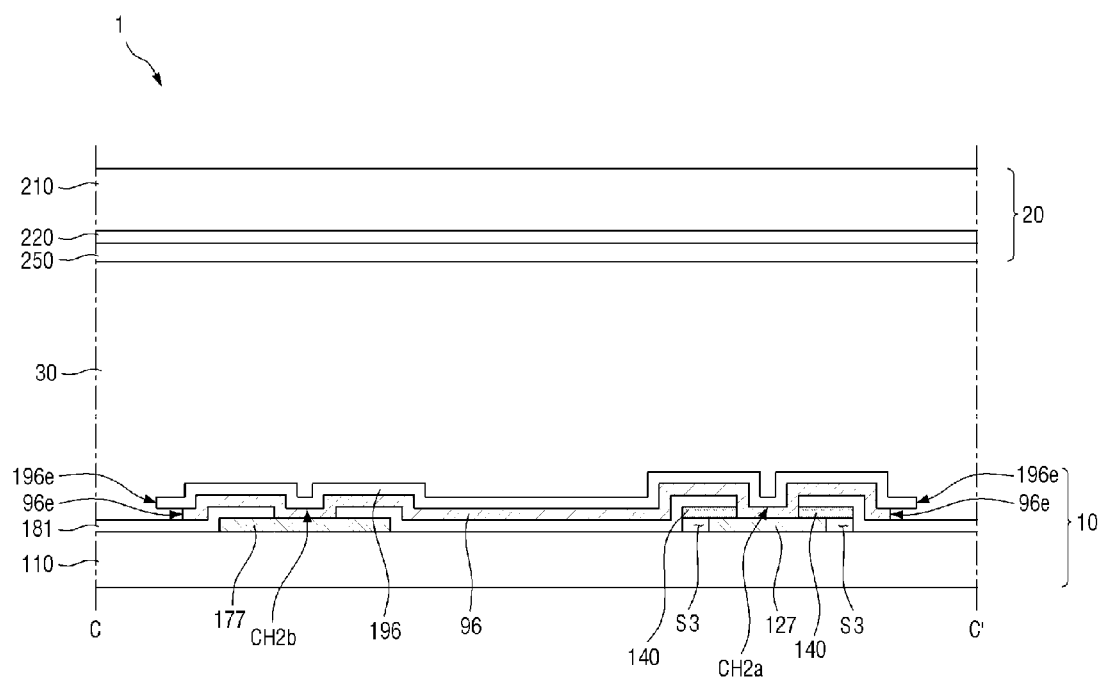
FIG. 4 is a cross-sectional view, taken along line C-C' of FIG. 1, of the display device according to the exemplary embodiment of FIG. 1.
Figure 5:
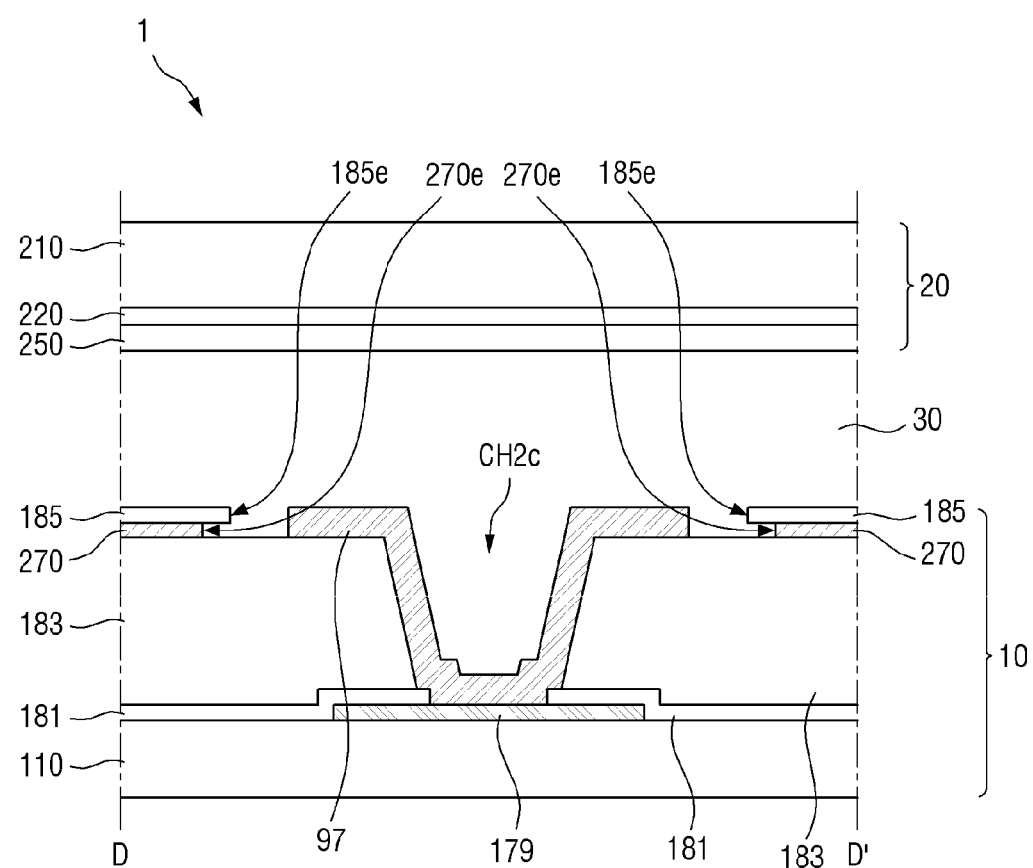
FIG. 5 is a cross-sectional view, taken along line D-D' of FIG. 1, of the display device according to the exemplary embodiment of FIG. 1.

FIG. 1 is a schematic layout view of a display device according to an exemplary embodiment of the present disclosure, FIG. 2 is a cross-sectional view, taken along line A-A' of FIG. 1, of the display device according to the exemplary embodiment of FIG. 1, FIG. 3 is a cross-sectional view, taken along line B-B' of FIG. 1, of the display device according to the exemplary embodiment of FIG. 1, FIG. 4 is a cross-sectional view, taken along line C-C' of FIG. 1, of the display device according to the exemplary embodiment of FIG. 1, and FIG. 5 is a cross-sectional view, taken along line D-D' of FIG. 1, of the display device according to the exemplary embodiment of FIG. 1.

Referring to FIGS. 1 through 5, a display device 1 may include a first display substrate 10, a second display substrate 20, which faces the first display substrate 10, and a liquid crystal layer 30, which is disposed between the first display substrate 10 and the second display substrate 20.

The first display substrate 10 will hereinafter be described.

A first base 110 may include an insulating substrate. For example, the first base 110 may include a glass substrate, a quartz substrate, or a transparent resin substrate. The first base 110 may comprise a polymer or plastic with high thermal resistance. In some exemplary embodiments, the first base 110 may be flexible. That is, the first base 110 may be a flexible insulating substrate that may be deformable through rolling, folding, or bending. The first base 110 may have a structure in which an insulating layer is deposited on an insulating substrate.

A gate conductor (121, 124, and 127) may be disposed on the first base 110. The gate conductor (121, 124, and 127) may be disposed directly on the first base 110.

The gate conductor (121, 124, and 127) may include a gate line 121 and a gate electrode 124 and may further include a gate pad portion 127. The gate line 121 may transmit a gate signal and may extend substantially in one direction (for example, a horizontal direction). The gate electrode 124 may project from the gate line 121 and may be connected to the gate line 121. The gate pad portion 127, which is connected to another layer or an external driving circuit and transmits a gate signal to the gate line 121, may be connected to the gate line 121. The gate conductor (121, 124, and 127) may comprise an opaque metal material, for example, aluminum (Al) or an Al-based metal such as an Al alloy, silver (Ag) or an Ag-based metal such as an Ag alloy, copper (Cu) or a Cu-based metal such as a Cu alloy, molybdenum (Mo) or a Mo-based metal such as a Mo alloy, chromium (Cr), tantalum (Ta), tungsten (W), or titanium (Ti). The gate conductor (121, 124, and 127) may have a single-layer structure or may have a multilayer structure consisting of at least two conductive layers having different physical properties.

Spaces (S1, S2, and S3) may exist around the gate conductor (121, 124, and 127). For example, a first space S1 may exist around the gate electrode 124, a second space S2 may exist around the gate line 121, and a third space S3 may exist around the gate pad portion 127.

A gate insulating layer 140 may be disposed on the gate conductor (121, 124, and 127). The gate insulating layer 140 may be formed of an insulating material. For example, the gate insulating layer 140 may be formed of silicon nitride (SiNx), silicon oxide (SiOx), or silicon oxynitride (SiOxNy). The gate insulating layer 140 may have a single-layer structure or may have a multilayer structure consisting of at least two organic layers having different physical properties.

In some exemplary embodiments, the gate insulating layer 140 may not contact the first base 110. More specifically, the gate insulating layer 140 may include an overlap portion, which overlaps with the gate conductor (121, 124, and 127), and a non-overlap portion, which does not overlap with the gate conductor (121, 124, and 127), and the non-overlap portion of the gate insulating layer 140 may be spaced apart from the first base 110 with the gate conductor (121, 124, and 127) provided therebetween. The non-overlap portion of the gate insulating layer 140 may be spaced apart from the first base 110 with the spaces (S1, S2, and S3) provided therebetween.

The planar shape of the gate insulating layer 140 may be substantially the same as the planar shape of the gate conductor (121, 124, and 127). The expression "the gate insulating layer 140 and the gate conductor (121, 124, and 127) having substantially the same planar shape", as used herein, indicates that the shape of the edges of the gate insulating layer 140 is substantially the same as the shape of the edges of the gate conductor (121, 124, and 127).

In a plan view, the area of the gate insulating layer 140 may be larger than the area of the gate conductor (121, 124, and 127), and the edges of the gate insulating layer 140 may project beyond the edges of the gate conductor (121, 124, and 127). For example, when viewed from above the display device 1, the edges of the gate insulating layer 140 may extend further than the edges of the gate conductor (121, 124, and 127).

A semiconductor pattern 154 may be disposed on the gate insulating layer 140. The semiconductor pattern 154 may overlap with the gate electrode 124. In some exemplary embodiments, the semiconductor pattern 154 may completely overlap with the gate electrode 124. That is, in a plan view, the edges of the semiconductor pattern 154 may be located more inwardly than the edges of the gate electrode 124. The semiconductor pattern 154 may be isolated from other parts in the same layer, and formed to overlap with the gate electrode 124, but not with the gate line 121 and the gate pad portion 127, although the present disclosure is not limited thereto. In some other exemplary embodiments, at least part of the semiconductor pattern 154 may be disposed on the gate line 121 while the entire pattern 154 overlaps with the gate line 121. The semiconductor pattern 154 may comprise amorphous silicon, polycrystalline silicon, or an oxide semiconductor.

A data conductor (171, 173, 175, 177, and 179), which includes a drain electrode 175 and a data line 171 having a source electrode 173, may be disposed on the first base 110 and the gate insulating layer 140.

The data line 171 may include a data pad portion 179, which is provided for connecting the data line 171 to another layer or an external driving circuit. The data line 171 may transmit a data signal and may extend in a direction (for example, a vertical direction) that crosses the direction in which the gate line 121 extends to intersect the gate line 121. In some exemplary embodiments, the data line 171 may be periodically bent for improving transmittance.

The source electrode 173 may be part of the data line 171 and may be disposed on the same line as the data line 171.

The drain electrode 175 may face the source electrode 173. The drain electrode 175 may include a bar portion, which extends substantially in parallel to the source electrode 173, and an expanded portion, which is provided on the opposite side of the bar portion. The drain electrode 175 and the source electrode 173 may be spaced apart from each other over the semiconductor pattern 154, and part of the semiconductor pattern 154 may be exposed between the drain electrode 175 and the source electrode 173.

The data conductor (171, 173, 175, 177, 179) may be formed of Al, Cu, Ag, Mo, Cr, Ti, Ta, or an alloy thereof and may have a multilayer structure consisting of a lower layer (not illustrated) formed of a refractive metal and a low-resistance upper layer formed on the lower layer, but the present disclosure is not limited thereto.

The gate electrode 124, the source electrode 173, and the drain electrode 175 may form a thin-film transistor (TFT) Tr together with the semiconductor layer 154.

Since the display device 1 includes the source electrode 173, which is disposed on the same line as the data line 171, and the drain electrode 175, which extends in parallel to the data line 171, the area occupied by the data conductor (171, 173, 175, 177, 179) inside the display device 1 may be relatively reduced. Accordingly, the aperture ratio of the display device 1 may be improved. However, the present disclosure is not limited to the shapes of the source electrode 173 and the drain electrode 175 set forth herein. That is, the shapes of the source electrode 173 and the drain electrode 175 may vary.

The TFT Tr of the display device 1 will hereinafter be described in detail with reference to FIGS. 6 through 8.

Figure 6:
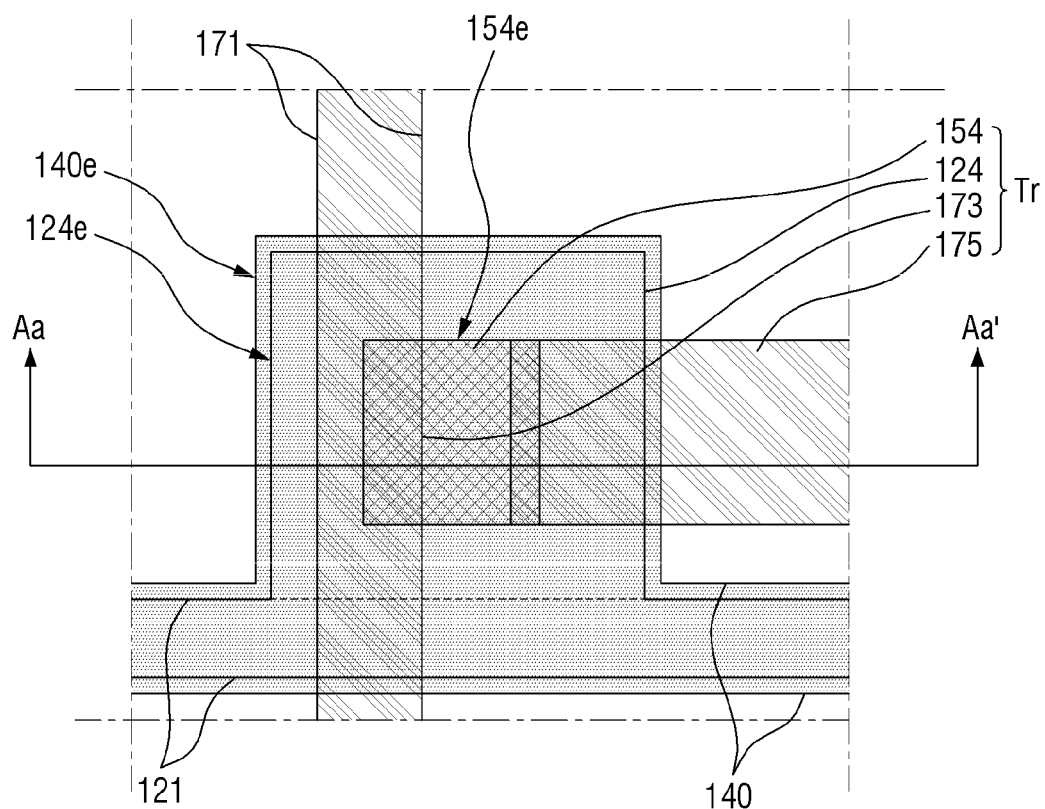
FIG. 6 is an enlarged view illustrating a thin-film transistor (TFT) of the display device according to the exemplary embodiment of FIG. 1.
Figure 7:
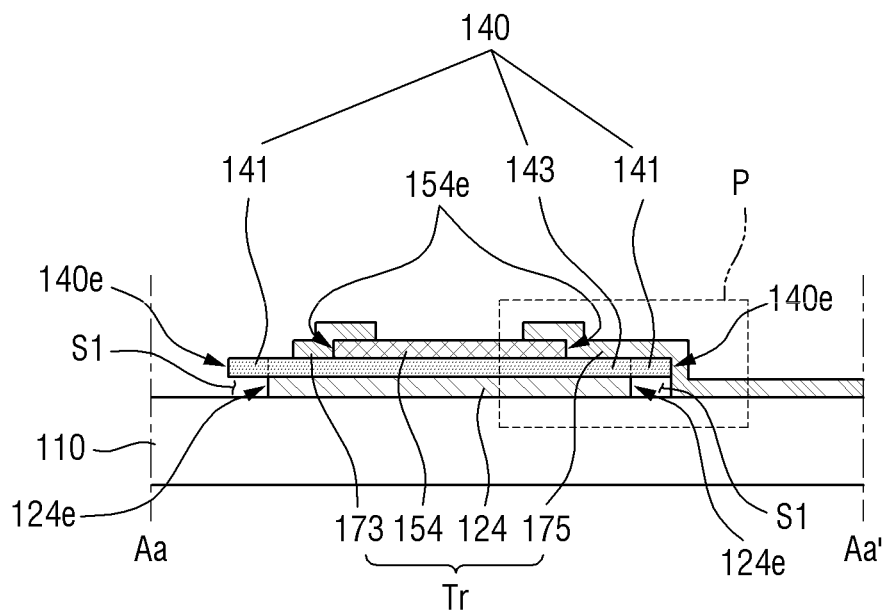
FIG. 7 is a cross-sectional view, taken along line Aa-Aa' of FIG. 6, of the TFT illustrated in FIG. 6.
Figure 8:
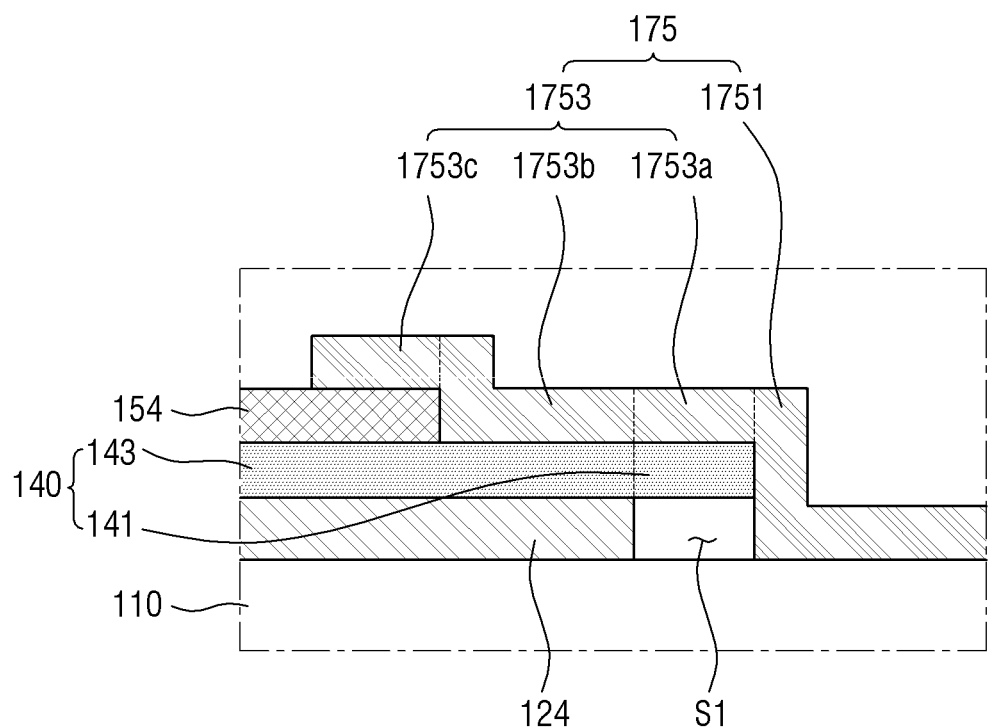
FIG. 8 is an enlarged cross-sectional view illustrating an area P of FIG. 6.

FIG. 6 is an enlarged view illustrating a TFT of the display device according to the exemplary embodiment of FIG. 1, FIG. 7 is a cross-sectional view, taken along line Aa-Aa' of FIG. 6, of the TFT illustrated in FIG. 6, and FIG. 8 is an enlarged cross-sectional view illustrating an area P of FIG. 6.

Referring to FIGS. 1, 2, and 6 through 8, in a plan view, edges 140e of the gate insulating layer 140 may project further than edges 124e of the entire gate electrode 124 except for a portion connected to the gate line 121, and the entire gate electrode 124 may overlap with the gate insulating layer 140.

The gate insulating layer 140 may include an overlap portion 143, which overlaps with the gate electrode 124, and a non-overlap portion 141, which does not overlap with the gate electrode 124, and the non-overlap portion 141 may be spaced apart from the first base 110 with the first space S1 provided therebetween.

The semiconductor pattern 154 may be disposed on the gate insulating layer 140, particularly, on the overlap portion 143 of the gate insulating layer 140. In a plan view, edges 154e of the semiconductor pattern 154 may be located more inwardly than the edges 140e of the gate insulating layer 140. In other words, the edges 140e of the gate insulating layer 140 may project further than the edges 154e of the semiconductor pattern 154, but the present disclosure is not limited thereto. Also, in a plan view, the edges 154e of the semiconductor pattern 154 may be located more inwardly than the edges 124e of the gate electrode 124. In other words, the edges 124e of the gate electrode 124 may project further than the edges 154e of the semiconductor pattern 154, but the present disclosure is not limited thereto. That is, alternatively, in a plan view, the edges 154e of the semiconductor pattern 154 may be disposed on the same lines as the edges 124e of the gate electrode 124.

The semiconductor pattern 154 may be isolated from other parts in the same layer, and the planar shape of the semiconductor pattern 154 may be substantially the same as the planar shape of the gate electrode 124. The area of the semiconductor pattern 154 may be the same as or smaller than the area of the gate electrode 124. Since the edges 154e of the semiconductor pattern 154 do not project beyond the edges 124e of the gate electrode 124, the whole semiconductor pattern 154 may be placed on the gate electrode 124. Accordingly, the gate electrode 124 may block or reflect light incident upon the semiconductor pattern 154 from below the first base 110 (for example, light incident from a backlight unit) and may thus prevent a leakage current from being generated in the TFT Tr. That is, the gate electrode 124 may serve as a light-blocking layer.

The source electrode 173 and the drain electrode 174, which contact the semiconductor pattern 154, may be disposed on the gate insulating layer 140.

The source electrode 173 may be part of the data line 171 and may be spaced apart from the first base 110 with the gate insulating layer 140 provided therebetween, but the present disclosure is not limited thereto. That is, alternatively, at least part of the source electrode 173 may contact the first base 110.

In a plan view, the drain electrode 175 may include a first portion 1751, which does not overlap with the gate insulating layer 140, and a second portion 1753, which is connected to the first portion 1751 and does not overlap with the gate insulating layer 140.

The first portion 1751 may be disposed on the same layer as the gate electrode 124. For example, the first portion 1751, like the gate electrode 124, may be disposed directly on the first base 110 and may contact the first base 110. Also, the first portion 1751 may be spaced apart from the gate electrode 124 with the first space S1 provided therebetween. That is, the drain electrode 175 and the gate electrode 124 may be spaced apart from each other with the first space S1 provided therebetween and thus may not contact each other.

The second portion 1753, which is connected to the first portion 1751, may contact the semiconductor pattern 154. The second portion 1753 may include a first sub-portion 1753a, which is connected to the first portion 1751, a second sub-portion 1753b, which is connected to the first sub-portion 1753a, and a third sub-portion 1753c, which is connected to the second sub-portion 1753b. The first sub-portion 1753a may be connected to the first portion 1751 and may overlap with the non-overlap portion 141 of the gate insulating layer 140. More specifically, the first sub-portion 1753a may overlap not with the gate electrode 124, but with the first space S1 around the gate electrode 124. The second sub-portion 1753b may overlap with the gate electrode 124 and the overlap portion 143 of the gate insulating layer 140, but not with the semiconductor pattern 154. The third sub-portion 1753c may overlap with the gate electrode 124, the overlap portion 143 of the gate insulating layer 140, and the semiconductor pattern 154.

As mentioned above, the edges 140e of the gate insulating layer 140 project further than the edges 124e of the gate electrode 124. Thus, the first space S1 is formed around the gate electrode 124. Thus, the gate electrode 124 and the drain electrode 175 do not connect to each other, and similarly, the gate electrode 124 and the source electrode 173 do not connect to each other.

Also, as mentioned above, the gate electrode 124 and the semiconductor pattern 154 may have substantially the same planar shape, and the gate insulating layer 140 and the gate conductor (121, 124, and 127) may have substantially the same planar shape. Thus, the gate conductor (121, 124, and 127), the gate insulating layer 140, and the semiconductor layer 154 may be formed using a single photomask, and thus, an increase in the manufacturing cost of the display device 1 may be prevented.

Referring again to FIGS. 1 through 5, a gate signal transmission pad portion 177, which is formed of the same layer as the data line 171, may be disposed near the gate pad portion 127. The gate signal transmission pad portion 177 may be electrically connected to the gate pad portion 127, and a gate signal transmitted from a gate driver to the gate signal transmission pad portion 177 may be provided to the gate line 121 through the gate pad portion 127.

The data conductor (171, 173, 175, 177, and 179) may be formed of Al, Cu, Ag, Mo, Cr, Ti, Ta, or an alloy thereof and may have a multilayer structure consisting of a lower layer (not illustrated) formed of a refractive metal and a low-resistance upper layer formed on the lower layer, but the present disclosure is not limited thereto. That is, the data conductor (171, 173, 175, 177, and 179) may be formed of various metals or conductors other than those set forth herein.

A first passivation layer 181 may be disposed on the first base 110 and the TFT Tr. The first passivation layer 181 may be formed of an organic insulating material or an inorganic insulating material. For example, the first passivation layer 181 may be formed of SiNx, SiOx, or SiOxNy. The first passivation layer 181 may have a single-layer structure or may have a multilayer structure consisting of at least two organic layers having different physical properties.

The first passivation layer 181 may contact the first base 110 in areas where the gate conductor (121, 124, and 127) and the data conductor (171, 173, 175, 177, and 179) are not provided. In other words, the first passivation layer 181 may have portions disposed on the same layer as the gate conductor (121, 124, and 127).

The first passivation layer 181 may be spaced apart from the gate conductor (121, 124, and 127). For example, the gate electrode 124 may be spaced apart from the first passivation layer 181, near the source electrode 173, with the first space S1 provided therebetween, the gate line 121 may be spaced apart from the first passivation layer 181 with the second space S2 provided therebetween, and the gate pad portion 127 may be spaced apart from the first passivation layer 181 with the third space S3 provided therebetween.

An organic layer 183 may be disposed on the first passivation layer 181. In some exemplary embodiments, the organic layer 183 may planarize the top of the first passivation layer 181. The organic layer 183 may be formed of an organic material. In some exemplary embodiments, the organic layer 183 may be formed of a photosensitive organic material.

The organic layer 183 may be disposed in a display area where an image is displayed. In some exemplary embodiments, the organic layer 183 may also be disposed in an area where the data pad portion 179 is provided. Also, in some exemplary embodiments, the organic layer 183 may not be disposed in areas where the gate pad portion 127 and the gate signal transmission pad portion 177 are provided. However, the present disclosure is not limited to these exemplary embodiments. That is, in some other exemplary embodiments, the organic layer 183 may not be disposed in the area where the data pad portion 179 is provided, or may be disposed in the areas where the gate pad portion 127 and the gate signal transmission pad portion 177 are provided.

In some other exemplary embodiments, the organic layer 183 may not be provided. In some other exemplary embodiments, the organic layer 183 may be a color filter, in which case, another layer may be further provided on the organic layer 183. For example, in order to prevent a pigment of the color filter from being introduced into the liquid crystal layer 30, a capping layer may be further provided on the organic layer 183, which is a color filter. The capping layer may be formed of an insulating material such as SiNx.

The organic layer 183 and the first passivation layer 181 may have a contact hole CH1, which exposes part of the drain electrode 175. Also, the first passivation layer 181 and the gate insulating layer 140 may have a first pad contact hole CH2a, which exposes the gate pad portion 127, and the first passivation layer 181 may have a second pad contact hole CH2b, which exposes the gate signal transmission pad portion 177. Also, the organic layer 183 and the first passivation layer 181 may have a third pad contact hole CH2c, which exposes the data pad portion 179.

A first electrode 270 may be disposed on the organic layer 183. In some exemplary embodiments, the first electrode 270 may be a common electrode. The first electrode 270 may be formed on the entire surface of the first base 110 in a planar shape and may receive a common voltage having a predetermined magnitude. In some exemplary embodiments, the first electrode 270 may be formed of a transparent conductive material. For example, the transparent conductive material may be indium tin oxide (ITO), indium zinc oxide (IZO), indium tin zinc oxide (ITZO), or Al-doped zinc oxide (AZO).

The first electrode 270 may have an electrode opening 270h, which is formed in an area corresponding to part of the drain electrode 175, particularly, an area corresponding to the contact hole CH1. That is, the electrode opening 270h may overlap with the contact hole CH1. A space SC may be formed around the electrode opening 270h.

A connecting member 96 may be disposed over the first pad contact hole CH2a, which exposes the gate pad portion 127, and the second pad contact hole CH2b, which exposes the gate signal transmission pad portion 177.

The connecting member 96 may connect the gate pad portion 127, which is exposed by the first pad contact hole CH2a, and the gate signal transmission pad portion 177, which is exposed by the second pad contact hole CH2b. A gate signal transmitted to the gate signal transmission pad portion 177 may be provided to the gate pad portion 127 through the connecting member 96 and may thus be provided to the gate line 121, which is connected to the gate pad portion 127.

In some exemplary embodiments, the connecting member 96 and the first electrode 270 may be formed on the same layer at the same time using the same material. For example, the connecting member 96, like the first electrode 270, may be formed of a transparent conductive material such as ITO or IZO. However, the present disclosure is not limited to these exemplary embodiments. That is, in some other exemplary embodiments, the connecting member 96 and a second electrode 191 that will be described later may be formed on the same layer using the same material.

A second passivation layer 185 may be disposed on the first electrode 270. The second passivation layer 185 may be formed of an organic insulating material or an inorganic insulating material.

The second passivation layer 185 may have a passivation opening 185h, which is formed in an area near the drain electrode 175. The passivation opening 185h may overlap with the contact hole CH1 and the electrode opening 270h.

The first electrode 270 and the second passivation layer 185 may have substantially the same planar shape. For example, in a plan view (or as viewed from above the display device 1), edges 270e of the first electrode 270 may substantially coincide with edges 185e of the second passivation layer 185.

In a plan view, the size and width of the electrode opening 270h of the first electrode 270 may be larger than the size and width of the passivation opening 185h of the second passivation layer 185.

The edges 185e of the second passivation layer 185 may project further than the edges 270e of the first electrode 270. More specifically, as viewed from above the display device 1, the edges 185e of the second passivation layer 185 may extend further than the edges 270e of the first electrode 270.

A passivation pattern 196 may be disposed on the connecting member 96. The passivation pattern 196 and the second passivation layer 185 may be formed on the same layer using the same material. The connecting member 96 and the passivation pattern 196 may have substantially the same planar shape. For example, in a plan view (or as viewed from above the display device 1), the shape of edges 96e of the connecting member 96 may be substantially the same as the shape of edges 196e of the passivation pattern 196.

The edges 196e of the passivation pattern 196 may project further than the edges 96e of the connecting member 96. More specifically, as viewed from above the display device 1, the edges 196e of the passivation pattern 196 may extend further than the edges 96e of the connecting member 96.

The second passivation layer 185 and the first electrode 270 may be disposed in the display area where a plurality of pixels are provided, and but not in areas around the gate pad portion 127 and the data pad portion 179.

As mentioned above, the first electrode 270 and the second passivation layer 185, which is disposed on the first electrode 270, may have substantially the same planar shape. Thus, the second passivation layer 185 and the first electrode 270 may be formed at the same time using a single photomask.

The second electrode 191 may be disposed on the second passivation layer 185. The second electrode 191 may have curved edges that are substantially parallel to the curved edges of the data line 171. The second electrode 191 may include a plurality of cutouts 91 and a plurality of branch electrodes 192, which are defined by the cutouts 91.

The second electrode 191 may include an extended portion 193, which extends toward the drain electrode 175. The extended portion 193 of the second electrode 191 may be physically and electrically connected to the drain electrode 175 via the contact hole CH1, the electrode opening 270h, and the passivation opening 185h and may receive a data voltage from the drain electrode 175.

A contact assisting member 97 may be disposed on the data pad portion 179 exposed by the third pad contact hole CH2c. The contact assisting member 97 may assist and protect the bonding between the data pad portion 179 and an external device.

The second electrode 191 and the contact assisting member 97 may be formed of a transparent conductive material such as ITO, IZO, ITZO, or AZO. The thickness of the second electrode 191 may be larger than the thickness of the first electrode 270, and similarly, the thickness of the connecting member 96 may be larger than the thickness of the contact assisting member 97. For example, a second thickness T2 of the second electrode 191 may be about two times larger a first thickness T1 of the first electrode 270. For example, the second electrode 191 and the contact assisting member 97 may have a thickness of about 900 Å.

As mentioned above, the size and width of the electrode opening 270h of the first electrode 270 may be larger than the size and width of the passivation opening 185h of the second passivation layer 185. The edges 185e of the second passivation layer 185 may project further than the edges 270e of the first electrode 270. Accordingly, part of the first electrode 191 on the second passivation layer 185 may be prevented from being connected to part of the first electrode 270 below the second passivation layer 185.

Since the second thickness T2 of the second electrode 191 is larger than the first thickness T1 of the first electrode 270, the second electrode 191 may be prevented from being disconnected due to the difference in height between the electrode opening 270h of the first electrode 270 and the passivation opening 185h of the second passivation layer 185.

Although not illustrated in FIGS. 1 through 5, a first alignment layer may be disposed on the second electrode 191 and part of the second passivation layer 185 not covered with the second electrode 191. The first alignment layer may be formed of an organic material such as polyimide, but the present disclosure is not limited thereto. In some exemplary embodiment, the first alignment layer may be a horizontal alignment layer and may be rubbed in a uniform direction. The first alignment layer may comprise a photoreactive material and may be photo-aligned.

The second display substrate 20 will hereinafter be described.

A second base 210 may include an insulating substrate. For example, the second base 210 may include a glass substrate, a quartz substrate, or a transparent resin substrate. The second base 210 may comprise a polymer or plastic with high thermal resistance. In some exemplary embodiments, the second base 210 may be flexible.

A light-blocking member 220 may be disposed on the second base 210. The light-blocking member 220 is also referred to as a black matrix and prevents light leakage.

A plurality of color filters 230 may be disposed on the second base 210. An overcoat layer 250 may be formed on the color filters 230 and the light-blocking member 220. The overcoat layer 250 may be formed of an (organic) insulating material, may prevent the color filters 230 from being exposed, and may provide a flat surface. However, the present disclosure is not limited to this. That is, in some other exemplary embodiments, the overcoat layer 250 may not be provided.

Although not illustrated in FIGS. 1 through 5, a second alignment layer may be disposed on the overcoat layer 250. The second alignment layer may be formed of an organic material such as polyimide, but the present disclosure is not limited thereto. In some exemplary embodiments, the second alignment layer may be a horizontal alignment layer and may be rubbed in a uniform direction. The second alignment layer may comprise a photoreactive material and may be photo-aligned.

The liquid crystal layer 30 may comprise a nematic liquid crystal material having positive dielectric anisotropy. Liquid crystal molecules in the liquid crystal layer 30 may be aligned so as for their long axes to be parallel to the first display substrate 10 and the second display substrate 20.

The second electrode 191 may receive a data voltage from the drain electrode 175, and the first electrode 270 may receive a uniform common voltage from a common voltage applying portion, which is disposed outside the display area.

The first electrode 270 and the second electrode 191, which are field-generating electrodes, generate an electric field, and thus, the liquid crystal molecules in the liquid crystal layer 30, which is disposed between the first electrode 270 and the second electrode 191, may rotate in a direction parallel to the direction of the electric field. Then, the polarization of light passing through the liquid crystal layer 30 may vary depending on the rotation direction of the liquid crystal molecules in the liquid crystal layer 30.

According to the present exemplary embodiment, the second passivation layer 185 and the first electrode 270 may be formed at the same time using a single photomask. Also, the gate conductor (121, 124, and 127), the gate insulating layer 140, and the semiconductor pattern 154 may be formed at the same time using a single photomask. Accordingly, an increase in the manufacturing cost of the display device 1 may be prevented. Also, since the gate electrode 124 is capable of blocking light incident thereupon from below the semiconductor pattern 154, a leakage current may be prevented from being generated in the TFT Tr.

A method of fabricating the display device according to the exemplary embodiment of FIG. 1 will hereinafter be described with reference to FIGS. 1 through 5 and 9 through 78. In FIGS. 1 through 5 and 9 through 78, like reference numerals indicate like elements, and thus, detailed descriptions thereof will be omitted.

Figure 9:
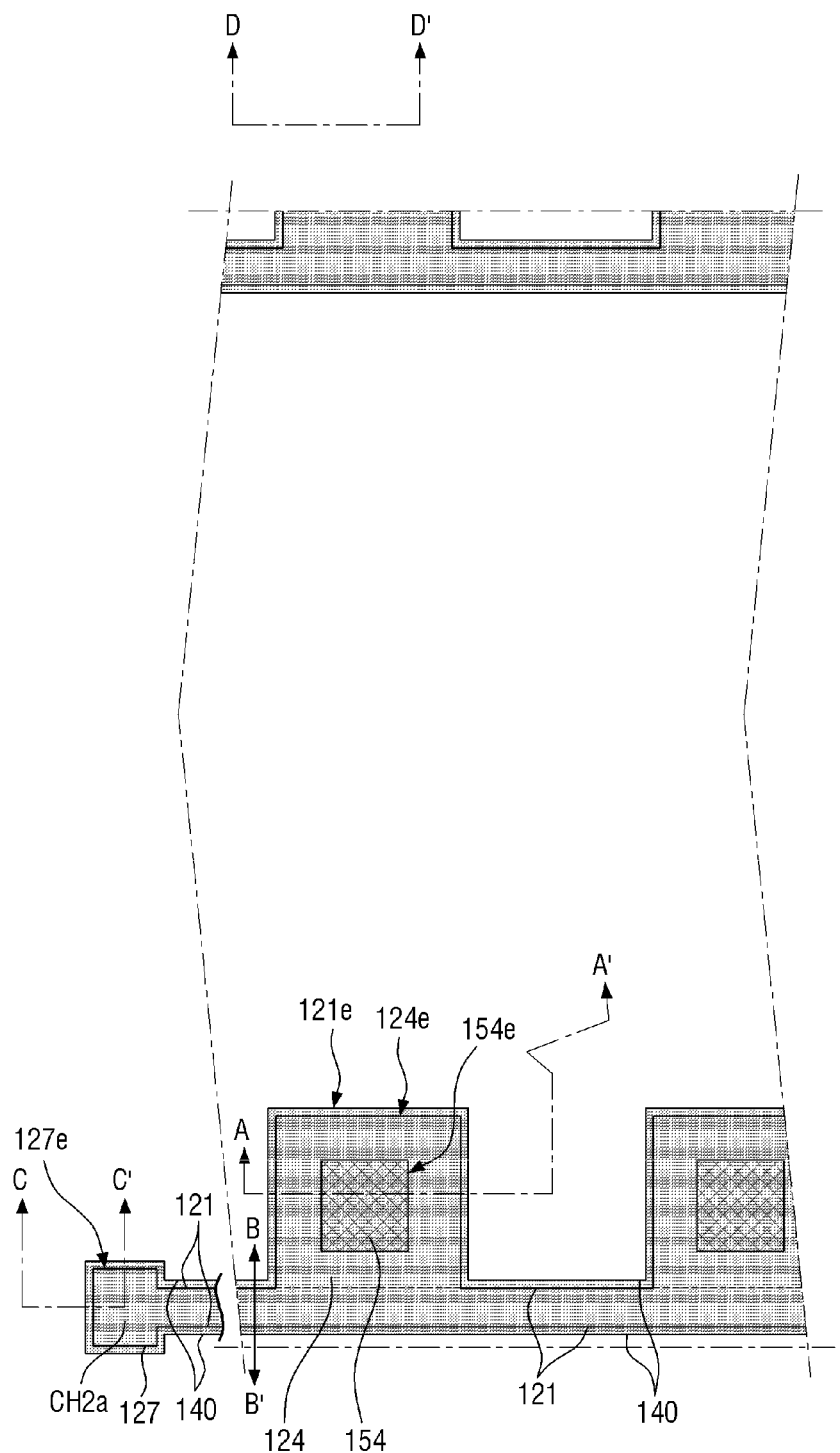
FIG. 9 is a layout view illustrating a method of fabricating the display device according to the exemplary embodiment of FIG. 1.
Figure 10:
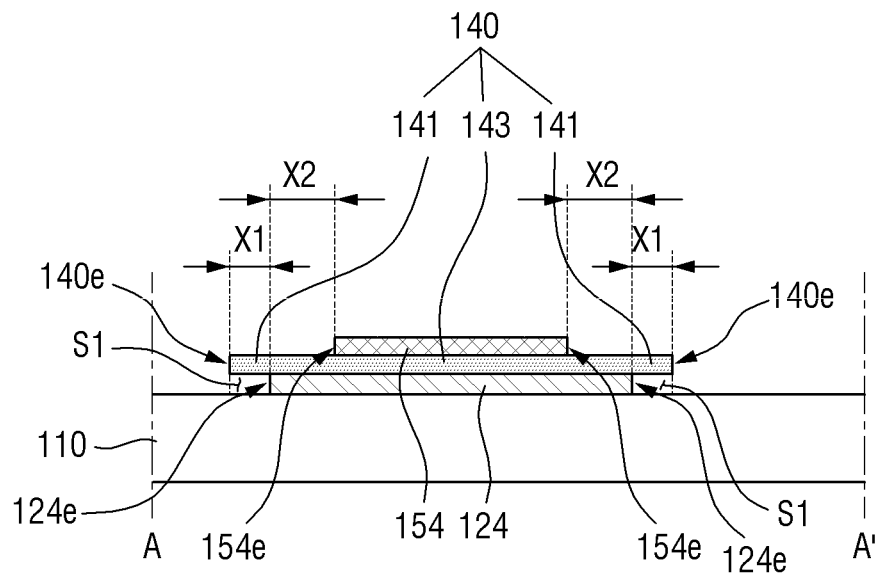
FIG. 10 is a cross-sectional view taken along line A-A' of FIG. 9.
Figure 11:
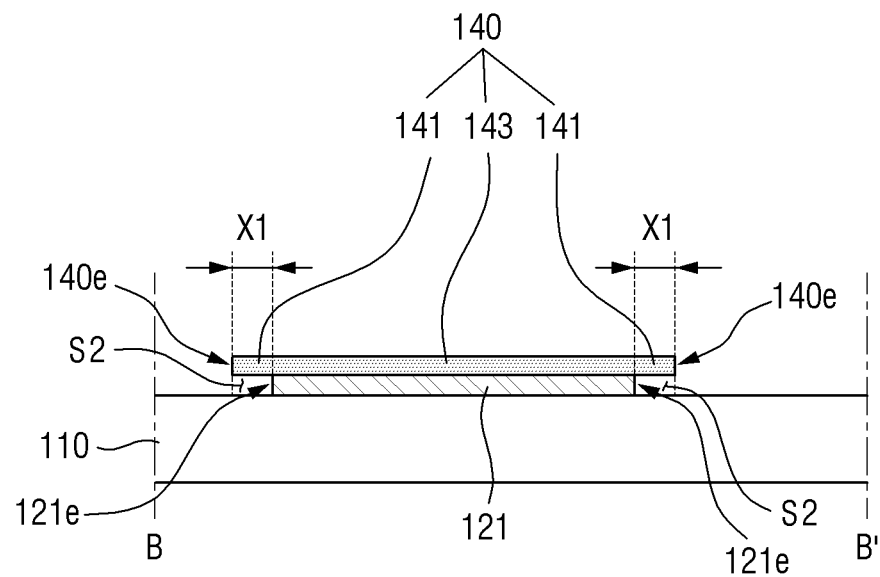
FIG. 11 is a cross-sectional view taken along line B-B' of FIG. 9.
Figure 12:
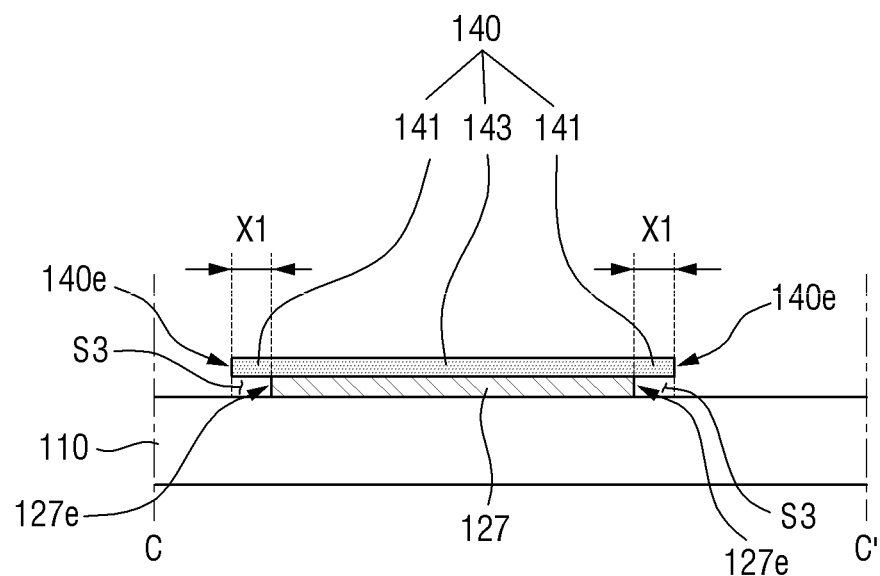
FIG. 12 is a cross-sectional view taken along line C-C' of FIG. 9.
Figure 13:
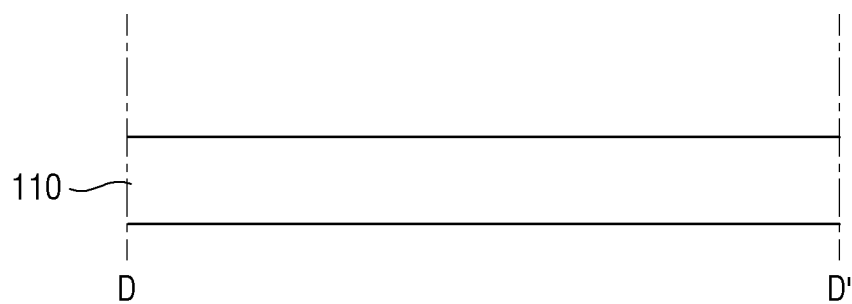
FIG. 13 is a cross-sectional view taken along line D-D' of FIG. 9.
Figure 14:
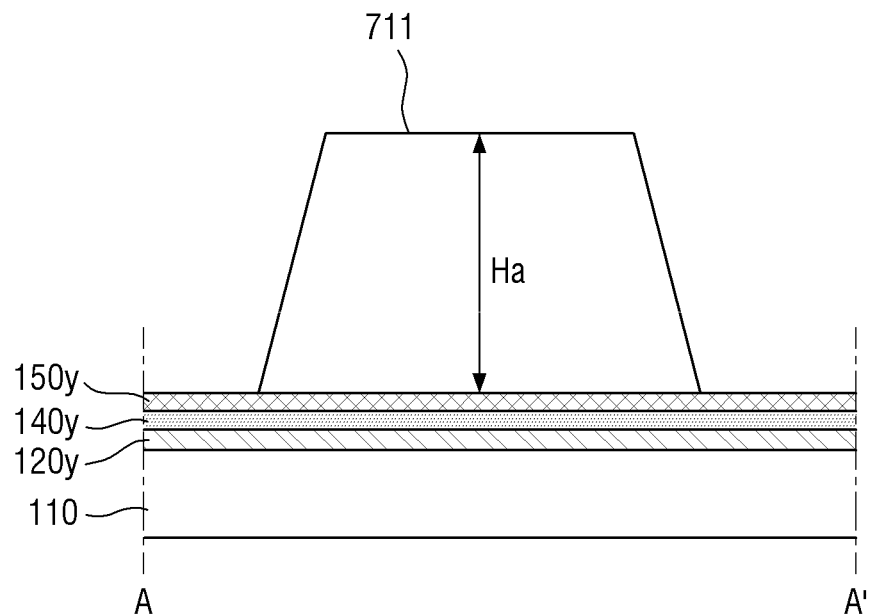
FIGS. 14, 15, 16, 17, 18, 19, 20, 21, 22, 23, 24, 25, 26, 27, 28, 29, 30, 31, 32, and 33 are cross-sectional views illustrating steps of the method of fabricating the display device according to the exemplary embodiment of FIG. 1, particularly, steps for forming a structure illustrated in FIGS. 9, 10, 11, 12, and 13.
Figure 15:
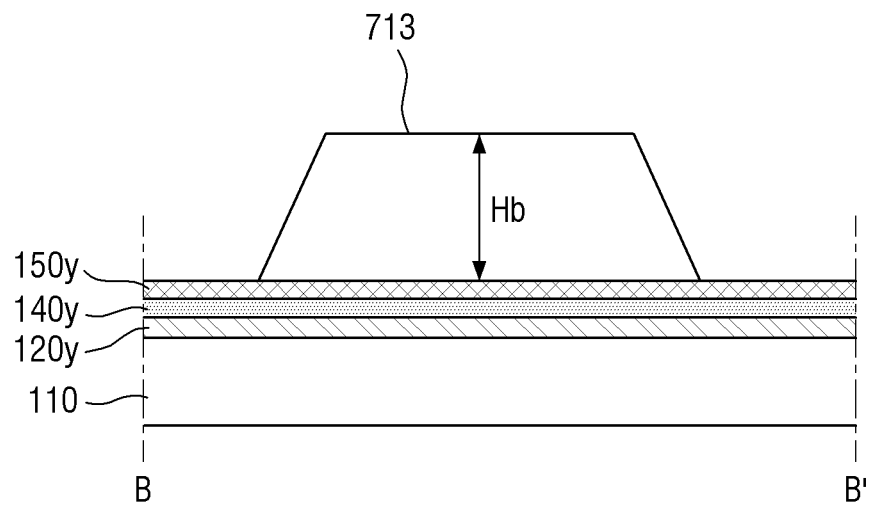
Figure 16:
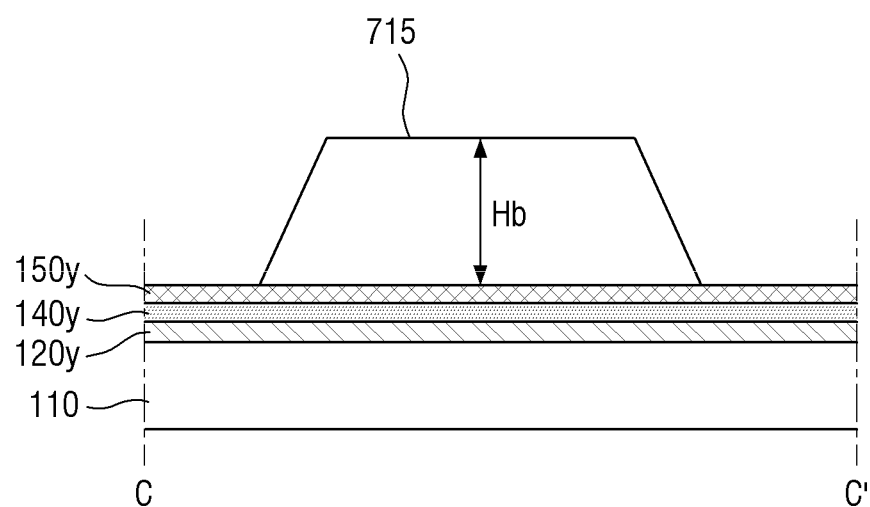
Figure 17:
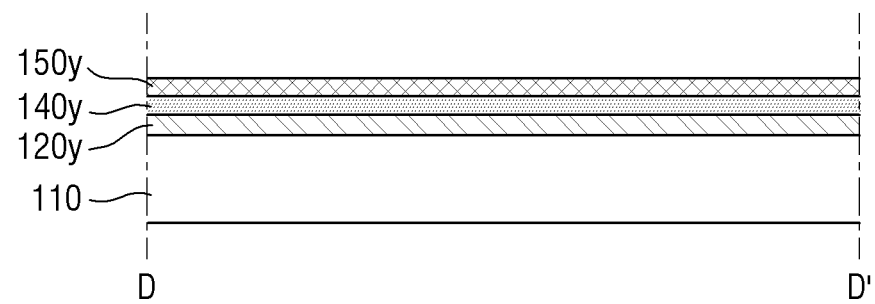
Figure 18:
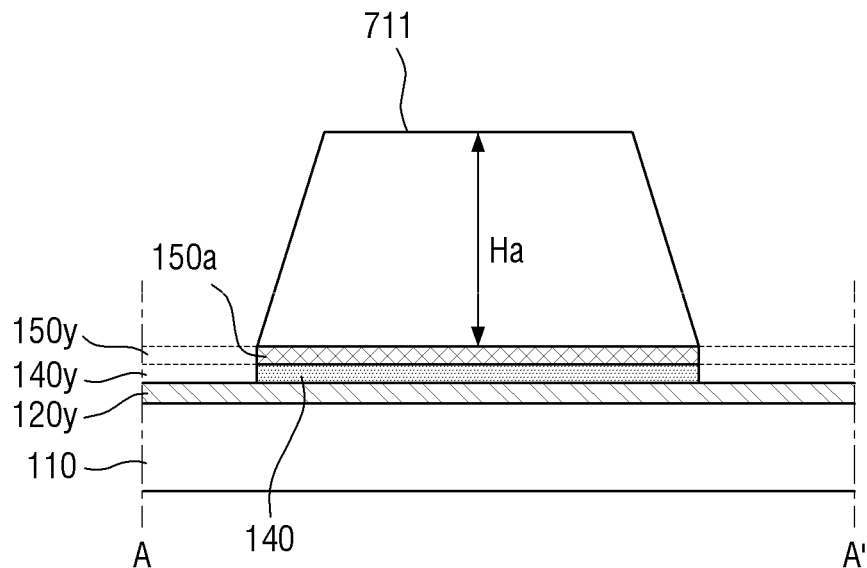
Figure 19:
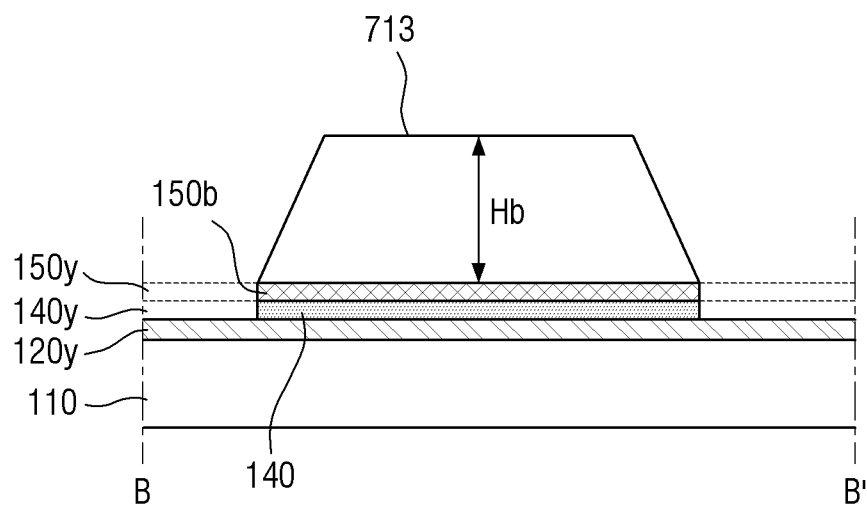
Figure 20:
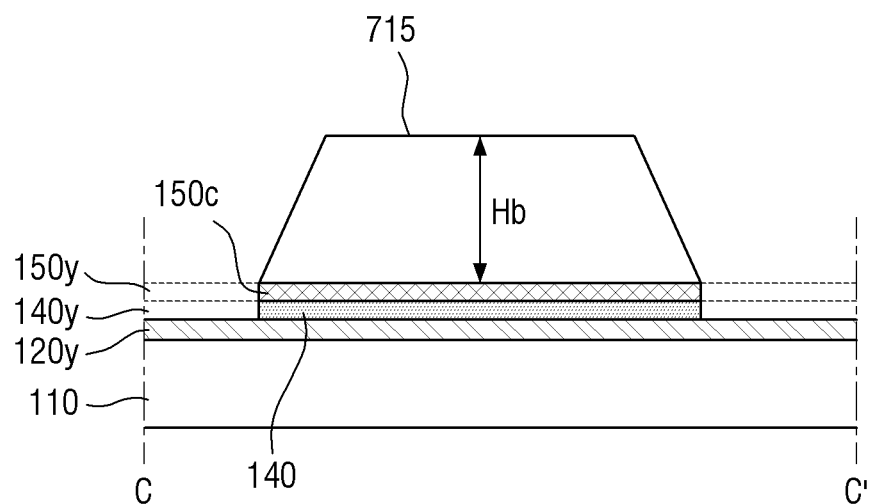
Figure 21:
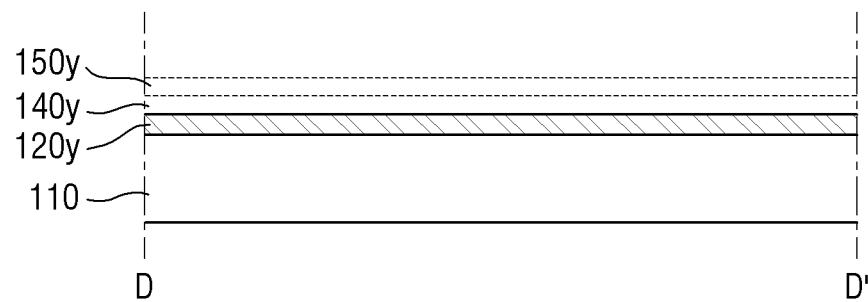
Figure 22:
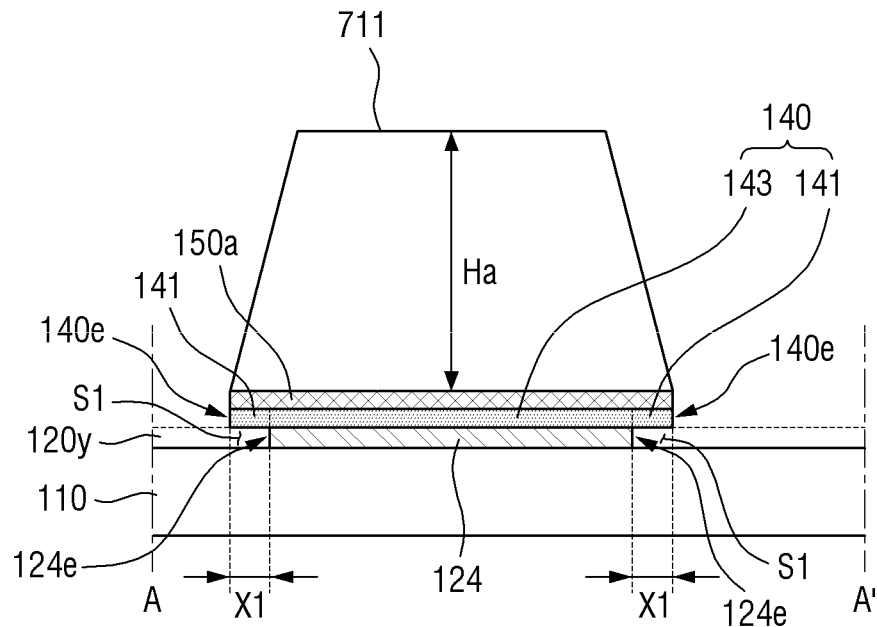
Figure 23:
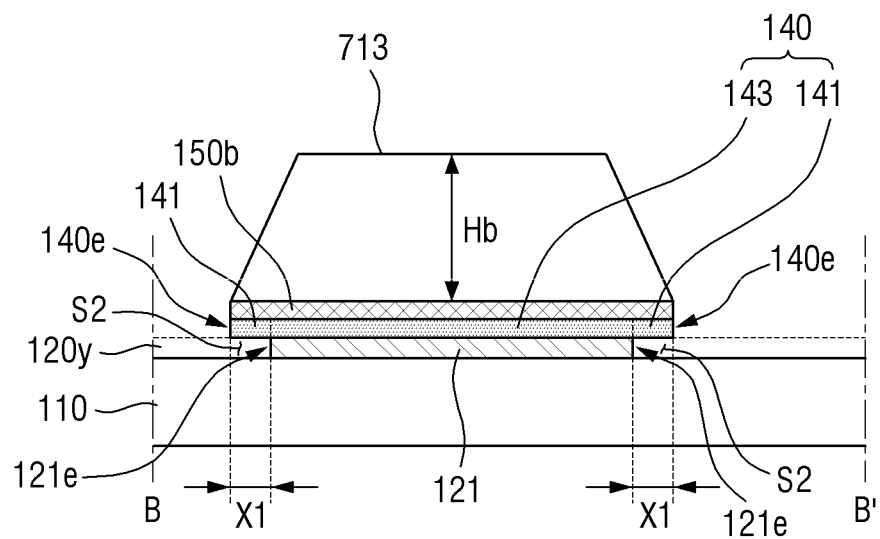
Figure 24:
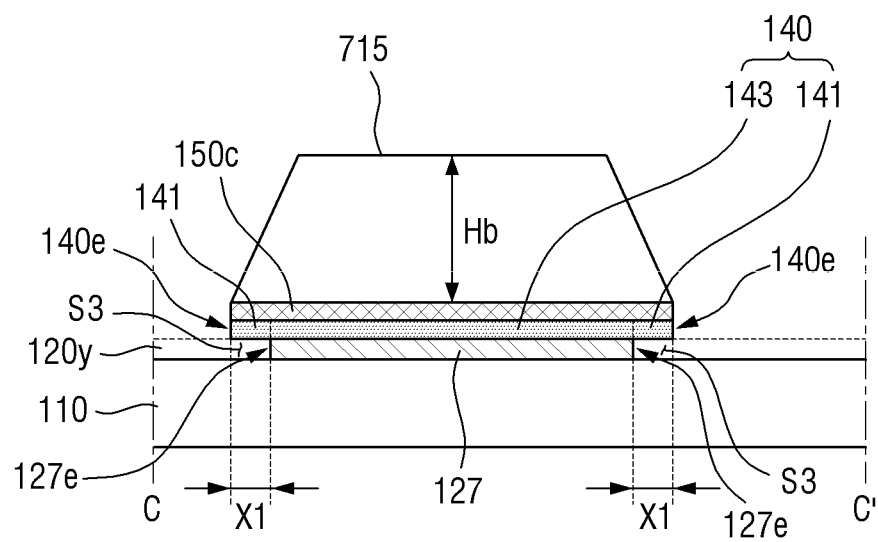
Figure 25:
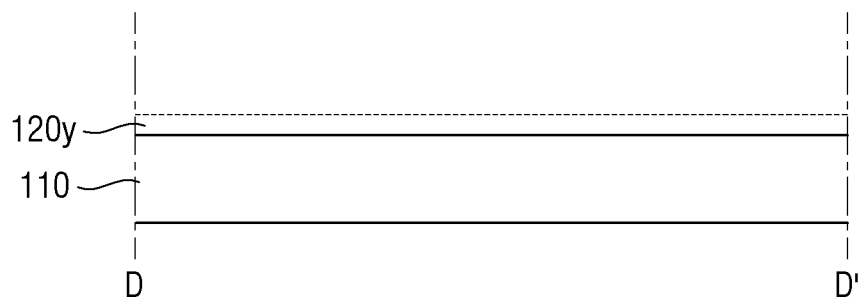
Figure 26:
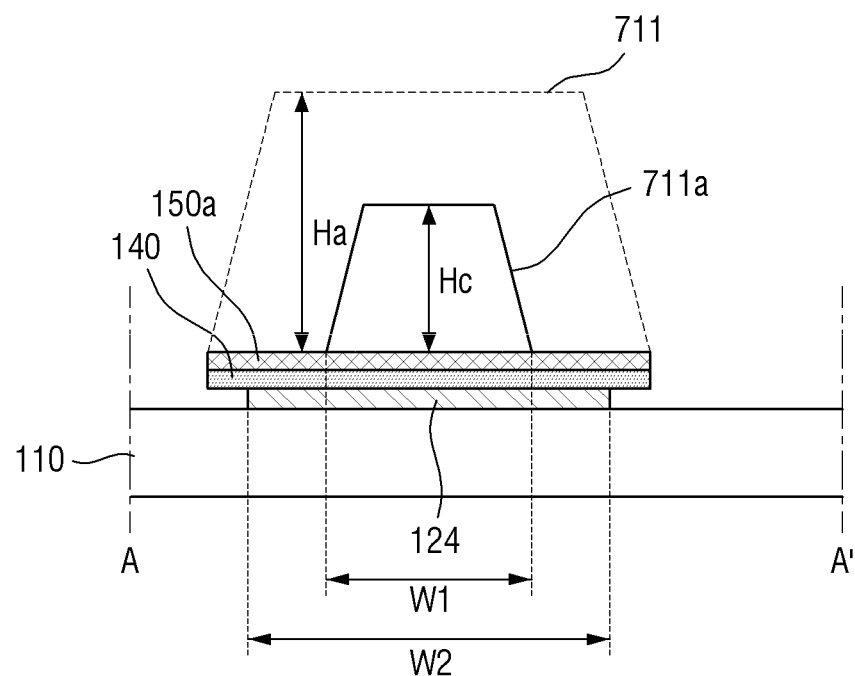
Figure 27:
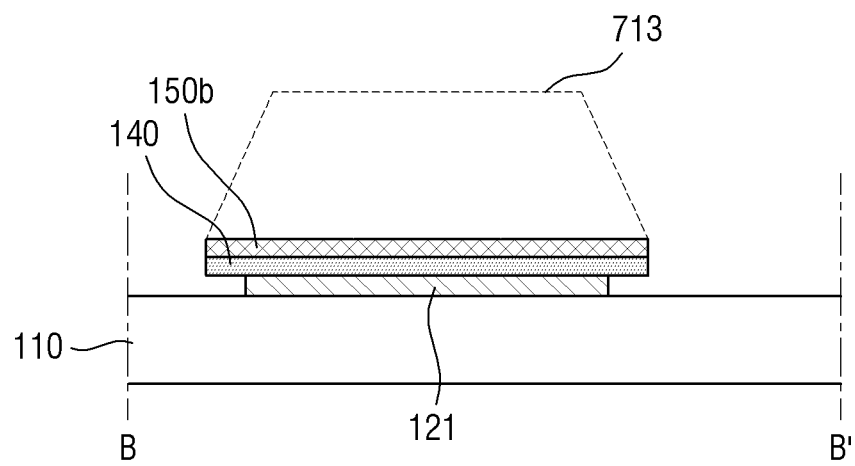
Figure 28:
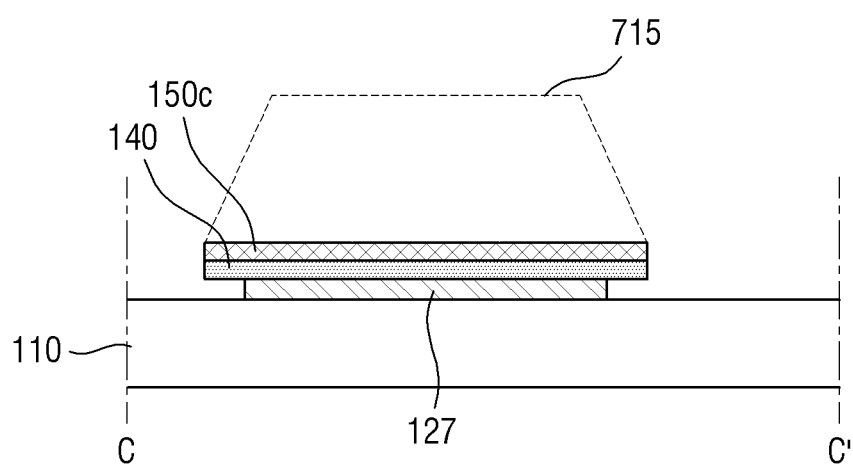
Figure 29:
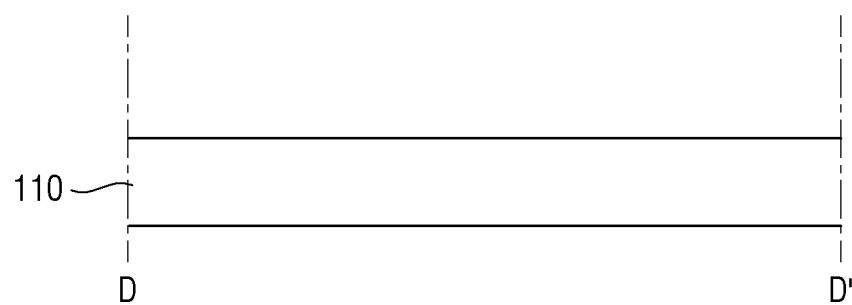
Figure 30:
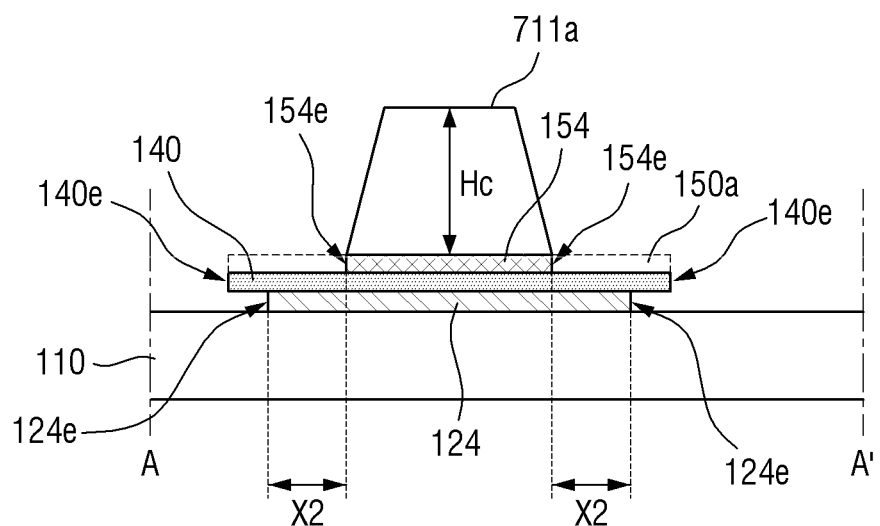
Figure 31:
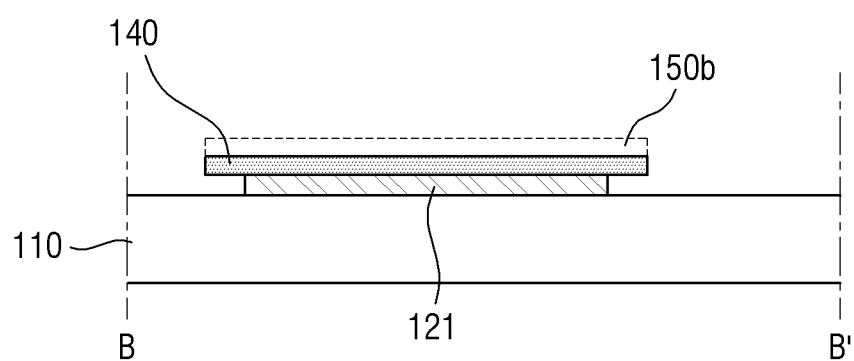
Figure 32:
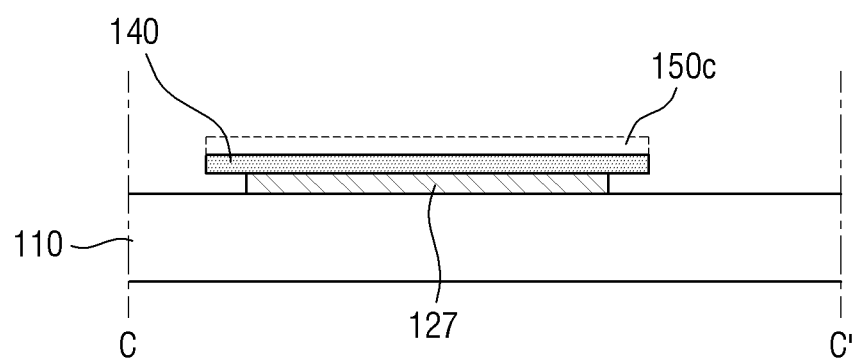
Figure 33:
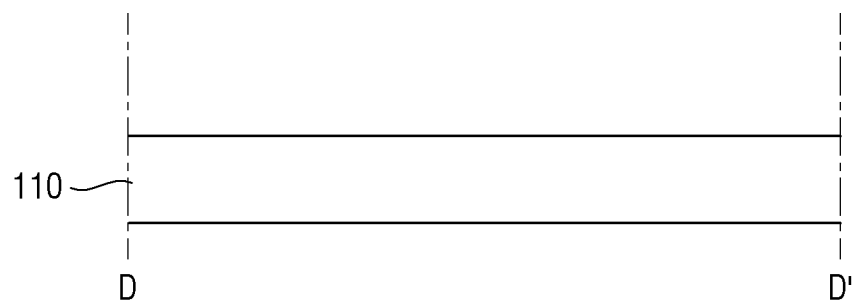

FIG. 9 is a layout view illustrating a method of fabricating the display device according to the exemplary embodiment of FIG. 1, FIG. 10 is a cross-sectional view taken along line A-A' of FIG. 9, FIG. 11 is a cross-sectional view taken along line B-B' of FIG. 9, FIG. 12 is a cross-sectional view taken along line C-C' of FIG. 9, FIG. 13 is a cross-sectional view taken along line D-D' of FIG. 9, and FIGS. 14 through 33 are cross-sectional views illustrating steps of the method of fabricating the display device according to the exemplary embodiment of FIG. 1, particularly, steps for forming a structure illustrated in FIGS. 9 through 13.

Referring to FIGS. 9 through 13, the gate conductor (121, 124, and 127), the gate insulating layer 140, and the semiconductor pattern 154 are formed on the first base 110.

As mentioned above, the gate conductor (121, 124, and 127), which includes the gate line 121, the gate electrode 124, and the gate pad portion 127, may be formed directly on the first base 110, and the spaces (S1, S2, and S3) may be formed around the gate conductor (121, 124, and 127).

The gate insulating layer 140 may be formed on the gate conductor (121, 124, and 127) and may include the overlap portion 143, which overlaps with the gate conductor (121, 124, and 127), and the non-overlap portion 141, which does not overlap with the gate conductor (121, 124, and 127). The non-overlap portion 141 may be spaced apart from the first base 110 with the spaces (S1, S2, and S3) provided therebetween. The edges 140e of the gate insulating layer 140 may project further than the edges of the gate conductor (121, 124, and 127). For example, the edges 140e of the gate insulating layer 140 may project beyond the edges of the gate electrode (121, 124, and 127) except for the portion connected to the gate line 121, i.e., the edges 124e of the gate electrode 124, the edges 121e of the gate line 121, and edges 127e of the gate pad portion 127, by as much as a first distance X1. That is, the width of the non-overlap portion 141 may be the same as the first distance X1.

The whole semiconductor pattern 154 may be formed on the gate insulating layer 140 and the gate electrode 124. The edges 154e of the semiconductor pattern 154 may be located more inwardly than the edges 140e of the gate insulating layer 140. The edges 154e of the semiconductor pattern 154 may be disposed on the same lines as the edges 124e of the gate electrode 124 or may be located more inwardly than the edges 124e of the gate electrode 124. In other words, a second distance X2 between the edges 124e of the gate electrode 124 and the edges 154e of the semiconductor pattern 154 may be zero or greater.

A method of forming the gate conductor (121, 124, and 127), the gate insulating layer 140, and the semiconductor pattern 154 at the same time will hereinafter be described with reference to FIGS. 14 through 33.

Referring to FIGS. 14 through 17, a first conductive layer 120y is formed on the first base 110 using an opaque metal material, and an insulating layer 140y is formed on the first conductive layer 120y using an insulating material. A semiconductor layer 150y is formed on the insulating layer 140y using a semiconductor material.

Thereafter, a first photosensitive layer is deposited on the semiconductor layer 150y and is subjected to exposure using a photomask such as a multi-tone mask (such as a halftone mask), thereby forming a first photosensitive layer pattern 711 having a first thickness Ha, a second photosensitive layer pattern 713 having a second thickness Hb, which is smaller than the first thickness Ha, and a third photosensitive layer pattern 715 having the second thickness Hb, which is smaller than the first thickness Ha. The first photosensitive layer pattern 711 may be formed in an area where a gate electrode is to be formed, the second photosensitive layer pattern 713 may be formed in an area where a gate line is to be formed, and the third photosensitive layer pattern 715 may be formed in an area where a gate pad portion is to be formed.

Thereafter, referring to FIGS. 18 through 21, the semiconductor layer 150y and the insulating layer 140y are sequentially dry-etched using the first photosensitive layer pattern 711, the second photosensitive layer pattern 713, and the third photosensitive layer pattern 715 as an etching mask. As a result, a first semiconductor layer pattern 150a is formed below the first photosensitive layer pattern 711, a second semiconductor layer pattern 150b is formed below the second photosensitive layer pattern 713, and a third semiconductor layer pattern 150c is formed below the third photosensitive layer pattern 715. The gate insulating layer 140 is formed below the first semiconductor layer pattern 150a, the second semiconductor layer pattern 150b, and the third semiconductor layer pattern 150c.

Thereafter, referring to FIGS. 22 through 25, the first conductive layer 120y is over-etched through wet etching using the first photosensitive layer pattern 711, the second photosensitive layer pattern 713, and the third photosensitive layer pattern 715 as an etching mask, thereby forming the gate conductor (121, 124, and 127). By over-etching the first conductive layer 120y, the edges of the gate conductor (121, 124, and 127), particularly, the edges 121e of the gate line 121, the edges 124e of the gate electrode 124, and the edges 127e of the gate pad portion 127, may be located more inwardly than the edges 140e of the gate insulating layer 140 by as much as the first distance X1. Also, by over-etching the first conductive layer 120y, the spaces (S1, S2, and S3) may be formed around the gate conductor (121, 124, and 127).

Thereafter, referring to FIGS. 26 through 29, the second photosensitive layer pattern 713 and the third photosensitive layer pattern 715 are removed by performing an ashing process. As a result of the removal of the second photosensitive layer pattern 713 and the third photosensitive layer pattern 715, the second semiconductor layer pattern 150b and the third semiconductor layer pattern 150c are exposed.

As mentioned above, the first photosensitive layer pattern 711 may be thicker than the second photosensitive layer pattern 713 and the third photosensitive layer pattern 715. Thus, during the removal of the second photosensitive layer pattern 713 and the third photosensitive layer pattern 715, the first photosensitive layer pattern 713 may be transformed into a fourth photosensitive layer pattern 711a having a smaller thickness and width than the first photosensitive layer pattern 713. A third thickness Hc of the fourth photosensitive layer pattern 711a may be smaller than the first thickness Ha of the first photosensitive layer pattern 711. A width W1 of the fourth photosensitive layer pattern 711a may be the same as or smaller than a width W2 of the gate electrode 124. Accordingly, part of the first semiconductor layer pattern 150a may be exposed without being covered by the fourth photosensitive layer pattern 711a.

Thereafter, referring to FIGS. 30 through 33, portions of the second semiconductor layer pattern 150b, the third semiconductor layer pattern 150c, and the first photosensitive layer pattern 150a not covered by the fourth photosensitive layer pattern 711a are etched using the fourth photosensitive layer pattern 711a as an etching mask. The etching of the portions of the second semiconductor layer pattern 150b, the third semiconductor layer pattern 150c, and the first photosensitive layer pattern 150a not covered by the fourth photosensitive layer pattern 711a may be performed using dry etching.

As a result of the steps described above with reference to FIGS. 14 through 33, the structure illustrated in FIGS. 9 through 13 may be fabricated.

Figure 34:
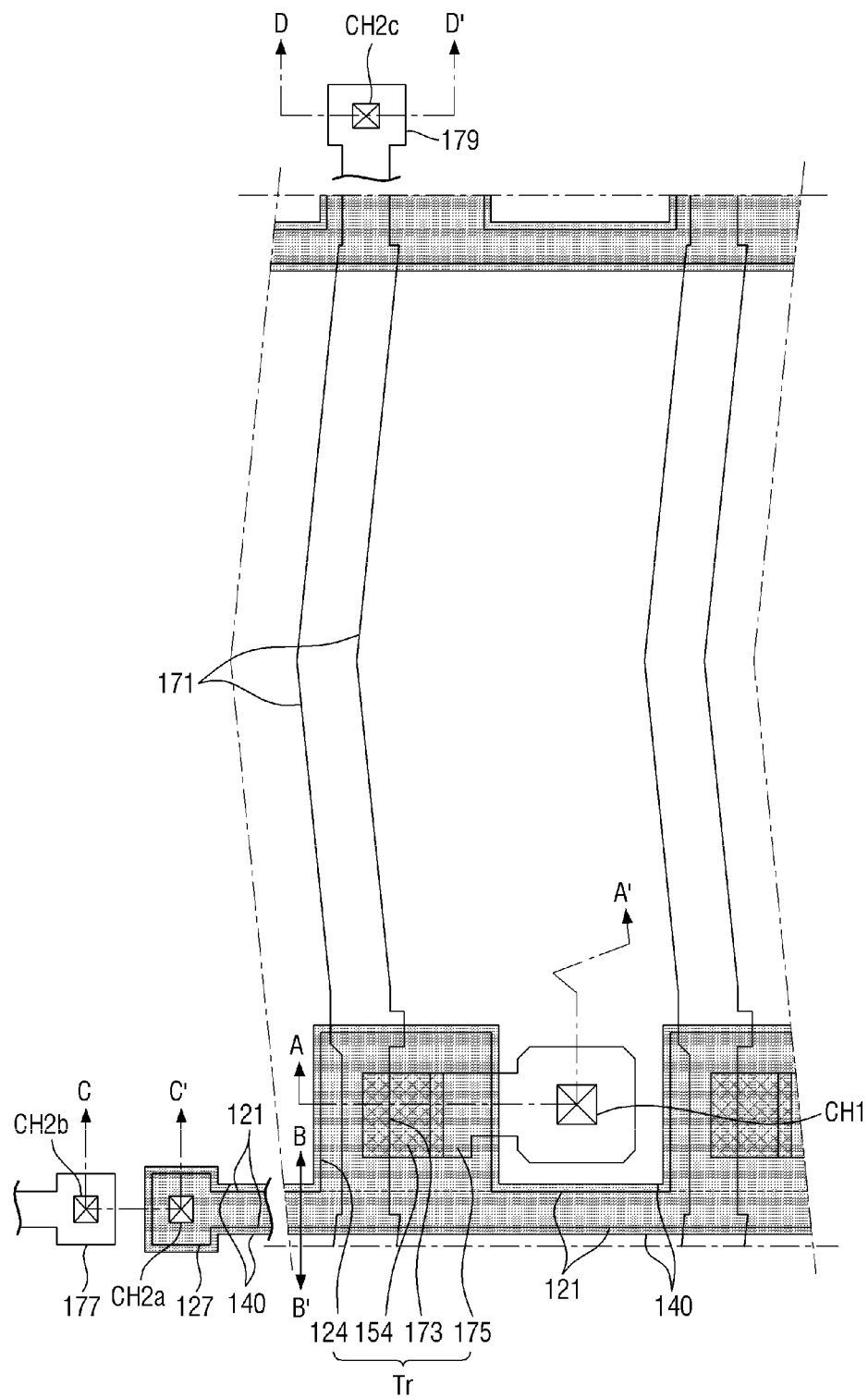
FIG. 34 is a layout view further illustrating the method of fabricating the display device according to the exemplary embodiment of FIG. 1, particularly, steps that follow a step illustrated in FIG. 9.
Figure 35:
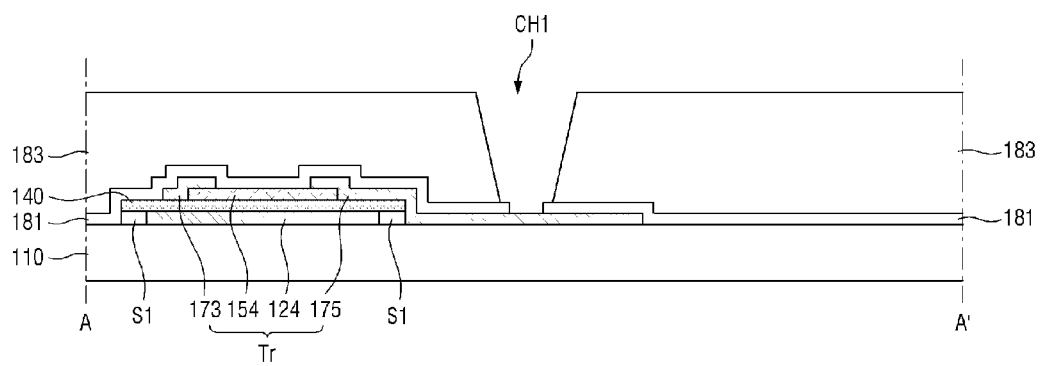
FIG. 35 is a cross-sectional view taken along line A-A' of FIG. 34.
Figure 36:
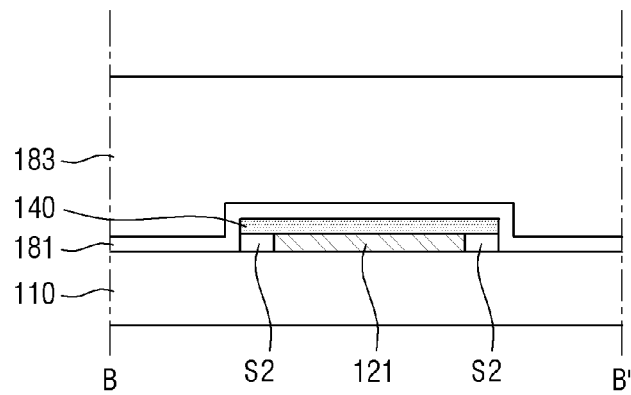
FIG. 36 is a cross-sectional view taken along line B-B' of FIG. 34.
Figure 37:
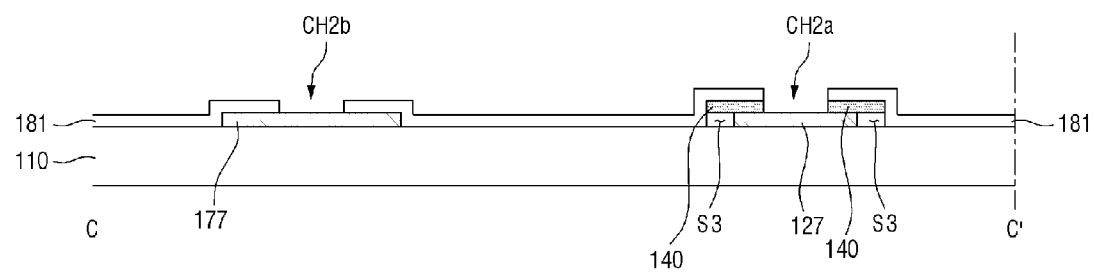
FIG. 37 is a cross-sectional view taken along line C-C' of FIG. 34.
Figure 38:
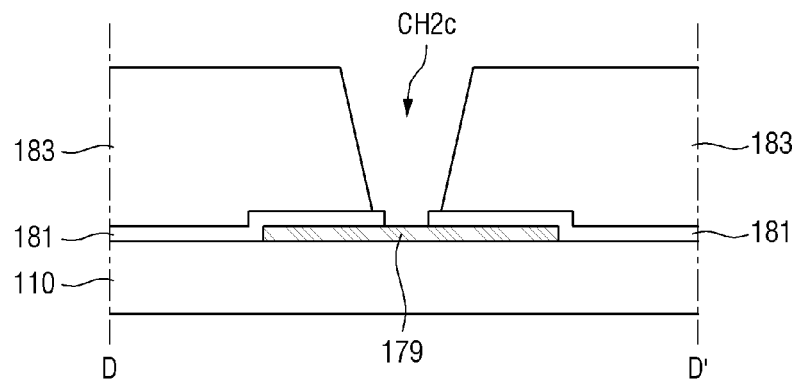
FIG. 38 is a cross-sectional view taken along line D-D' of FIG. 34.

FIG. 34 is a layout view further illustrating the method of fabricating the display device according to the exemplary embodiment of FIG. 1, particularly, steps that follow a step illustrated in FIG. 9, FIG. 35 is a cross-sectional view taken along line A-A' of FIG. 34, FIG. 36 is a cross-sectional view taken along line B-B' of FIG. 34, FIG. 37 is a cross-sectional view taken along line C-C' of FIG. 34, FIG. 38 is a cross-sectional view taken along line D-D' of FIG. 34, and FIGS. 39 through 58 are cross-sectional views further illustrating the method of fabricating the display device according to the exemplary embodiment of FIG. 1, particularly, steps for forming a structure illustrated in FIGS. 34 through 39.

Referring to FIGS. 34 through 38, after the fabrication of the structure illustrated in FIGS. 9 through 13, the data conductor (171, 173, 175, 177, and 179) is formed, the first passivation layer 181 is formed on the entire surface of the first base 110 and on the data conductor (171, 173, 175, 177, and 179), and the organic layer 183 is formed on the first passivation layer 181. As mentioned above, the organic layer 183 may not be formed in the area where the gate signal transmission pad portion 177 and the gate pad portion 127 are provided.

The organic layer 183 and the first passivation layer 181 may have the contact hole CH1, which exposes the drain electrode 175, and the third pad contact hole CH2c, which exposes the data pad portion 179, the first passivation layer 181 and the gate insulating layer 140 may have the first pad contact hole CH2a, which exposes the gate pad portion 127, and the first passivation layer 181 may have the second pad contact hole CH2b, which exposes the gate signal transmission pad portion 177.

A method of forming the data conductor (171, 173, 175, 177, and 179), the first passivation layer 181, the organic layer 183, the contact hole CH1, the first pad contact hole CH2a, the second pad contact hole CH2b, and the third pad contact hole CH2c will hereinafter be described with reference to FIGS. 39 through 58.

Figure 39:
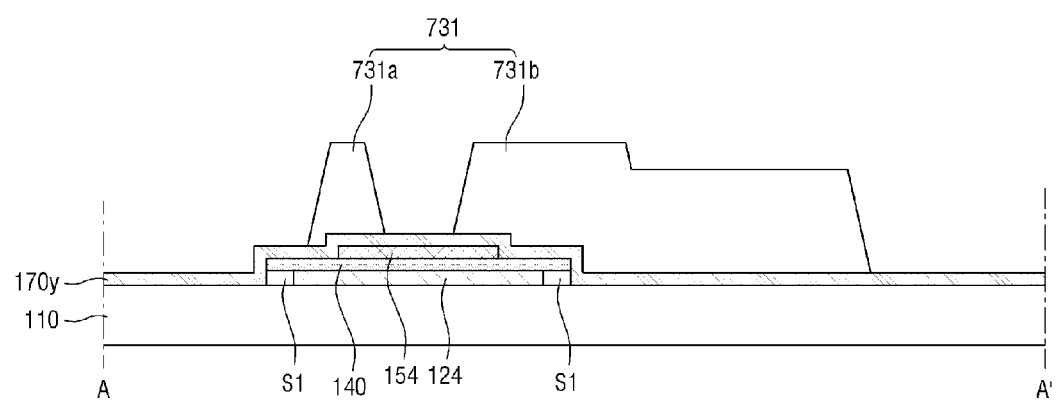
FIGS. 39, 40, 41, 42, 43, 44, 45, 46, 47, 48, 49, 50, 51, 52, 53, 54, 55, 56, 57, and 58 are cross-sectional views further illustrating the method of fabricating the display device according to the exemplary embodiment of FIG. 1, particularly, steps for forming a structure illustrated in FIGS. 34, 35, 36, 37, 38, 39.
Figure 40:
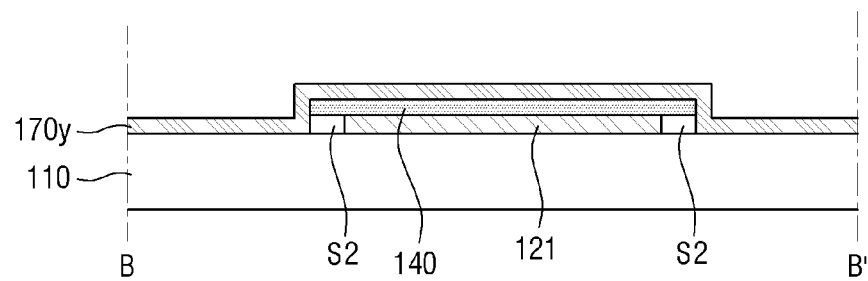
Figure 41:
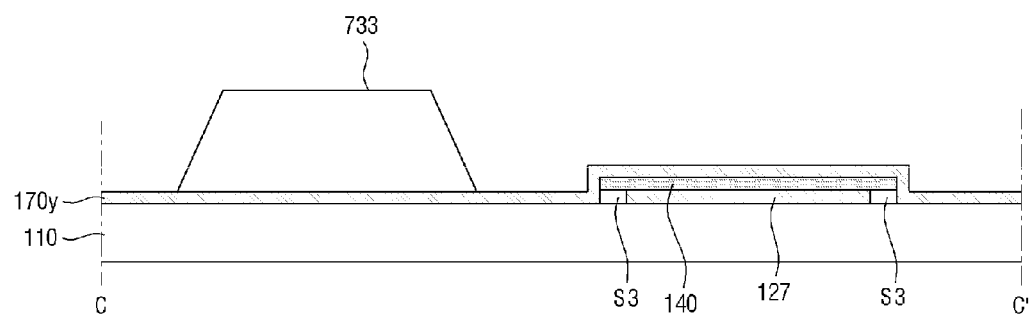
Figure 42:
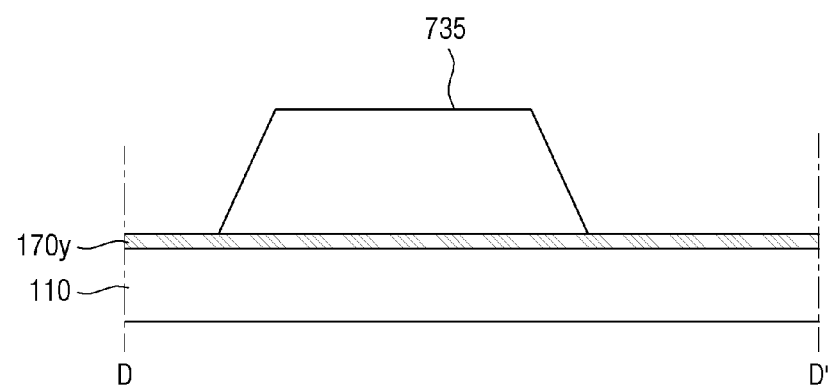
Figure 43:
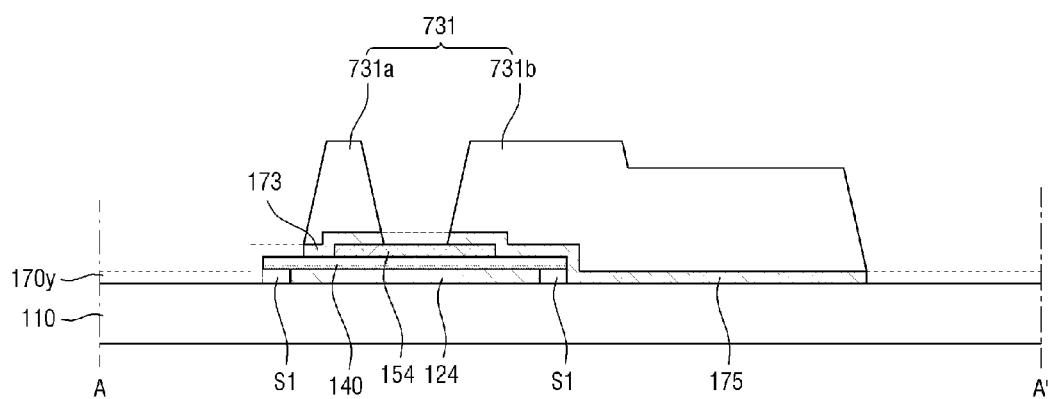
Figure 44:
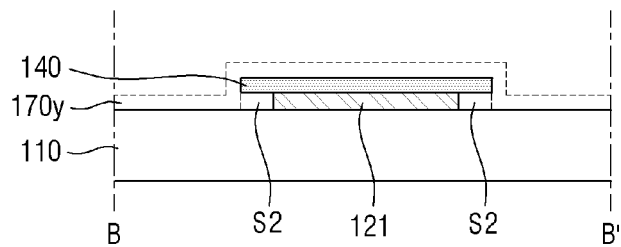
Figure 45:
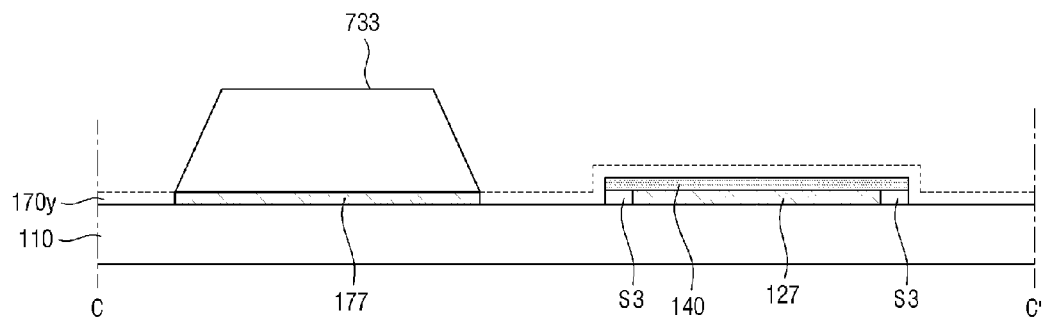
Figure 46:
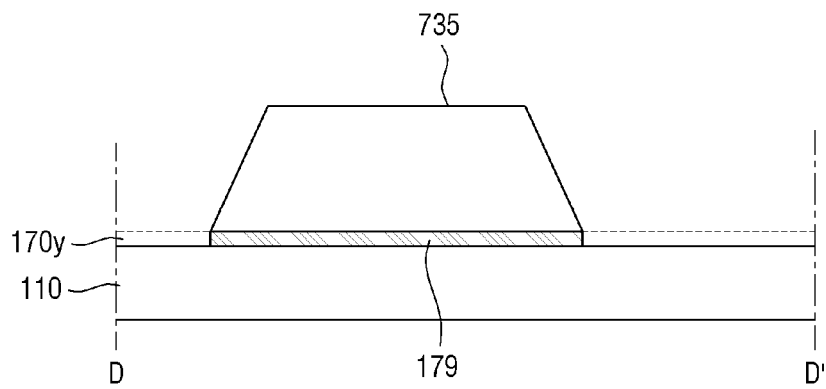
Figure 47:
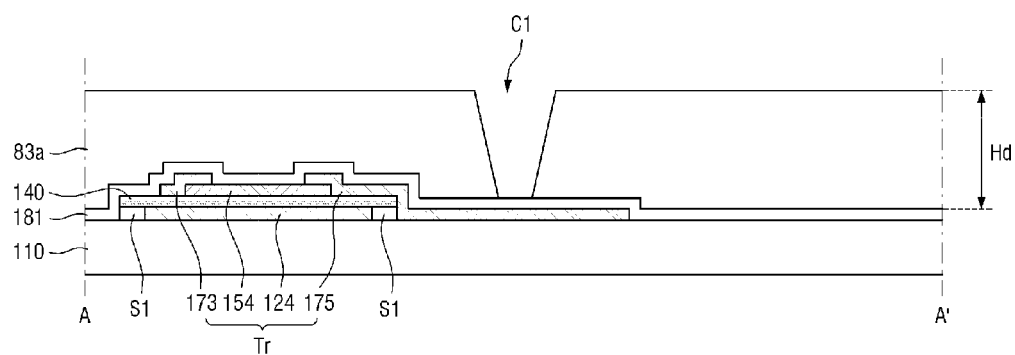
Figure 48:
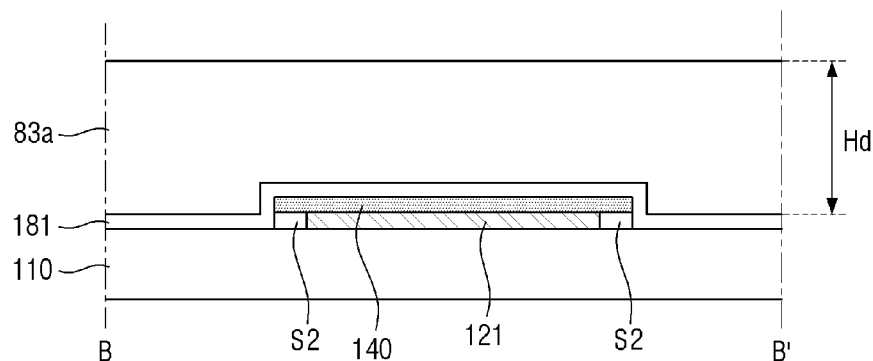
Figure 49:
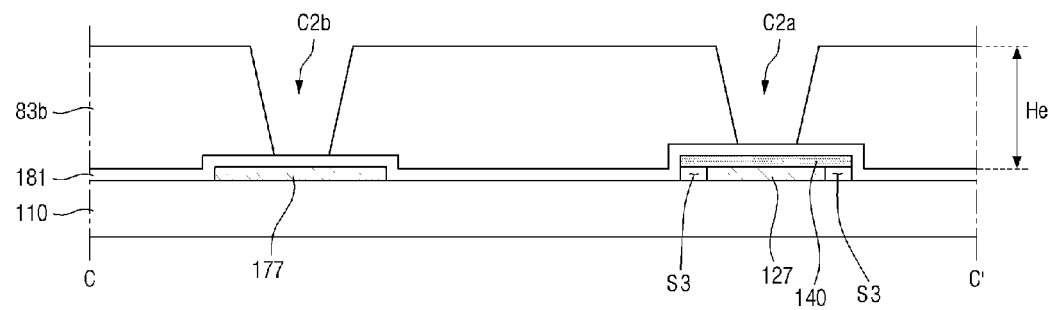
Figure 50:
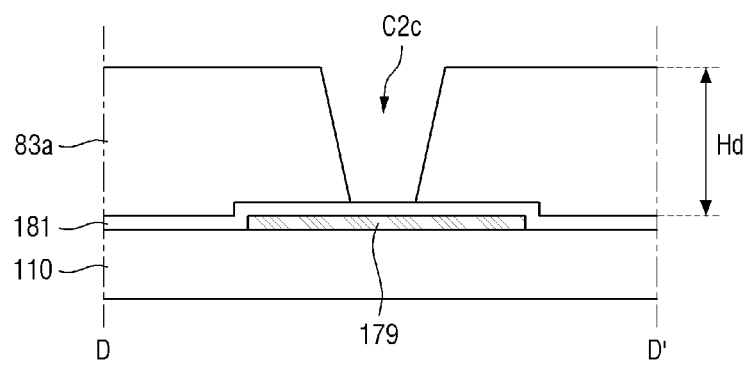
Figure 51:
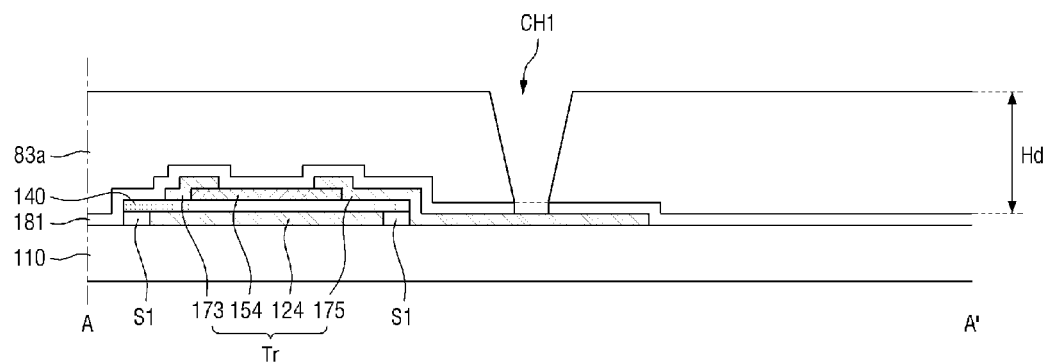
Figure 52:
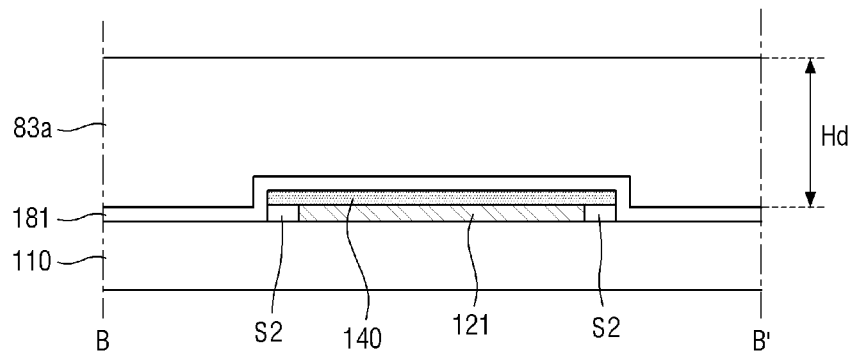
Figure 53:
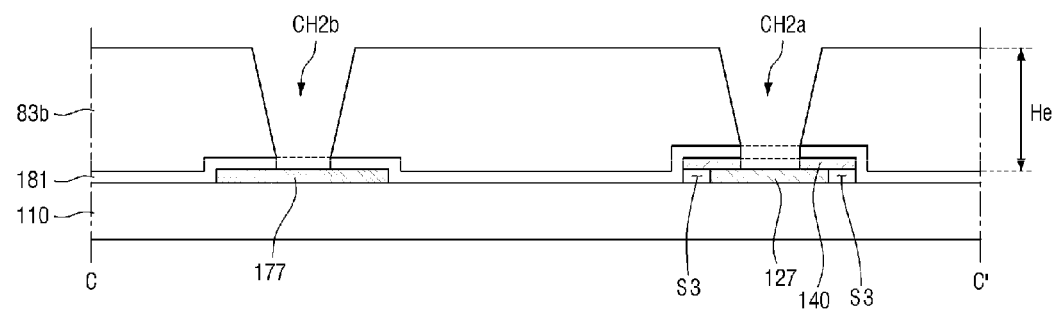
Figure 54:
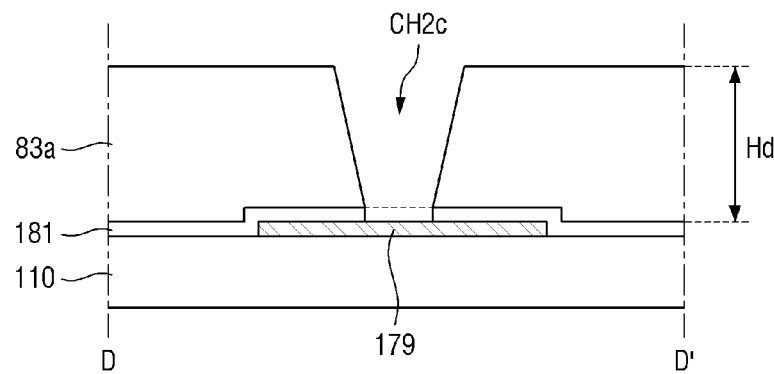
Figure 55:
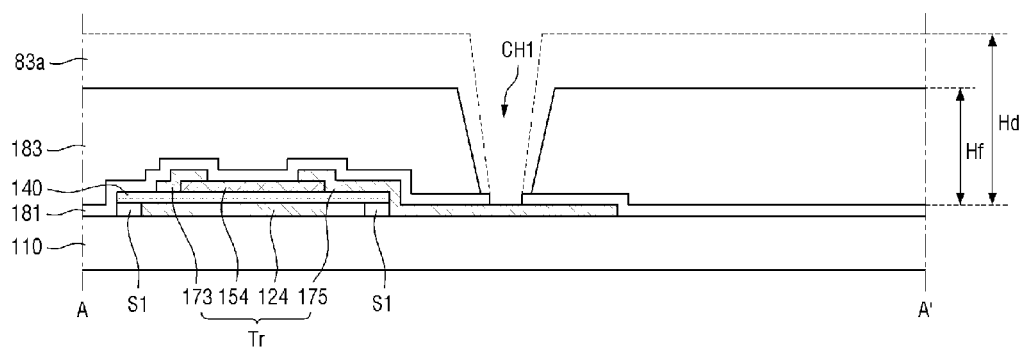
Figure 56:
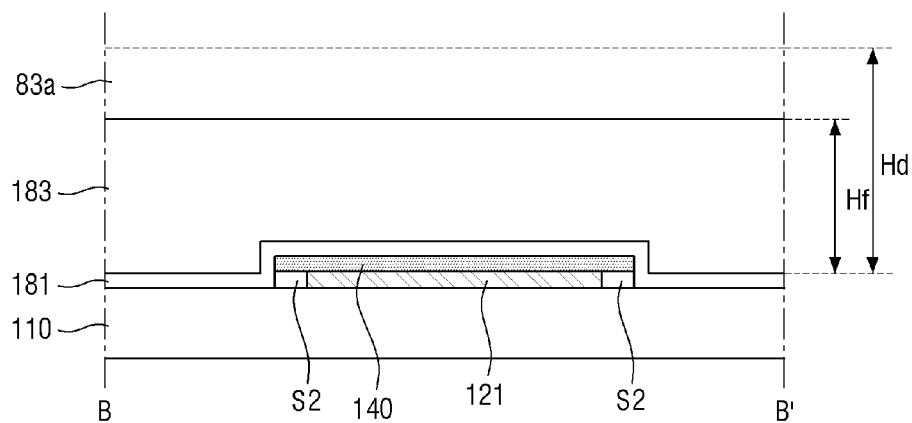
Figure 57:
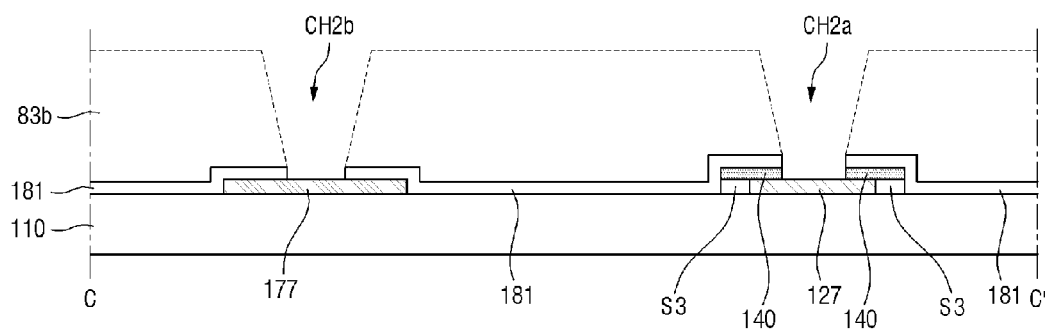
Figure 58:
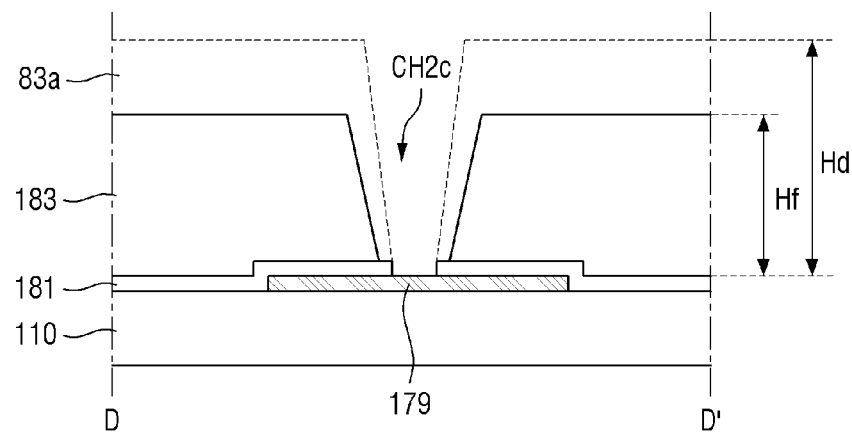
Figure 59:
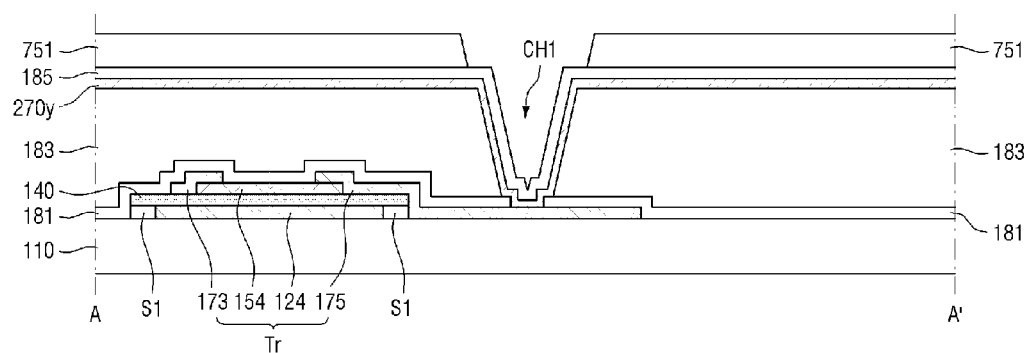
FIGS. 59, 60, 61, 62, 63, 64, 65, 66, 67, 68, 69, 70, 71, 72, 73, 74, 75, 76, 77, and 78 are cross-sectional views further illustrating the method of fabricating the display device according to the exemplary embodiment of FIG. 1, particularly, steps that follow the steps illustrated in FIGS. 55, 56, 57, and 58.
Figure 60:
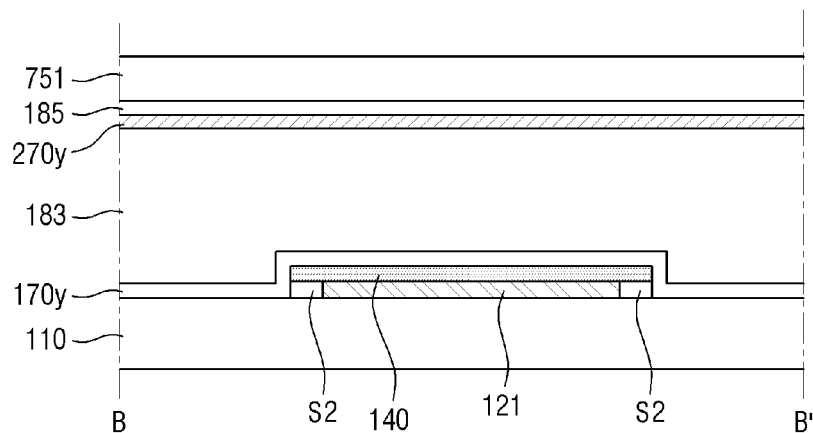
Figure 61:
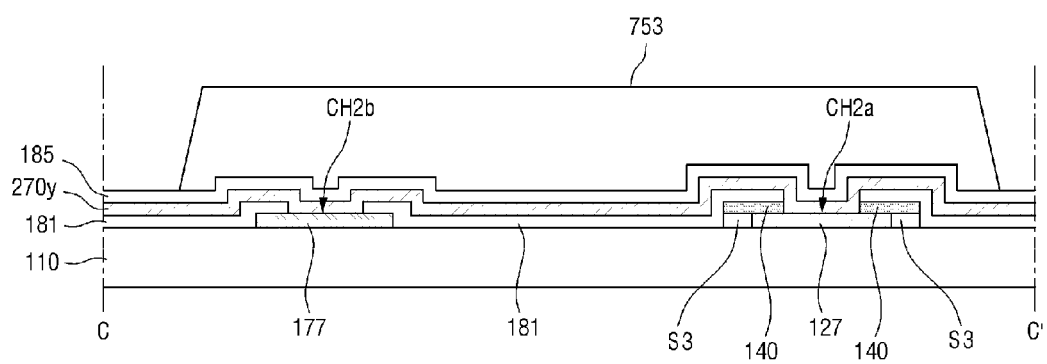
Figure 62:
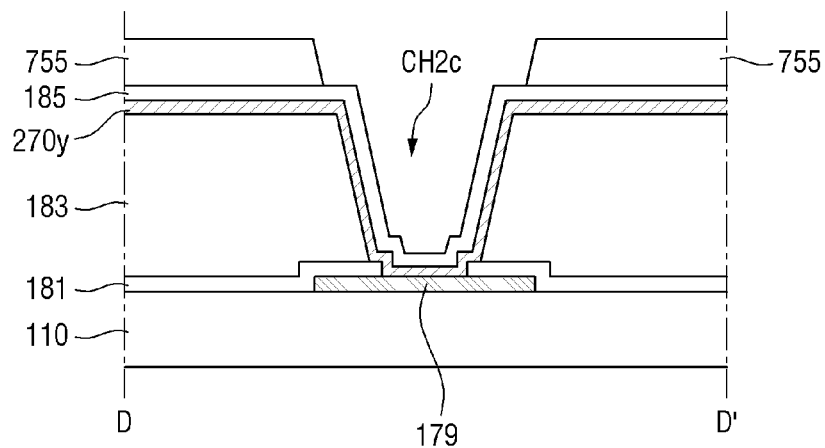
Figure 63:
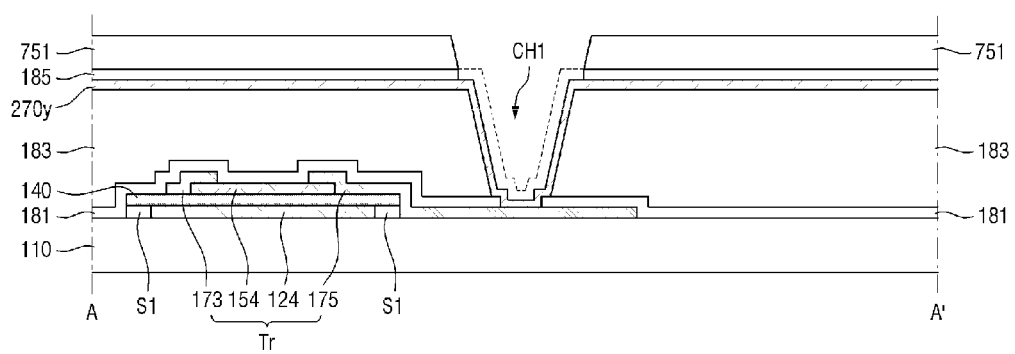
Figure 64:
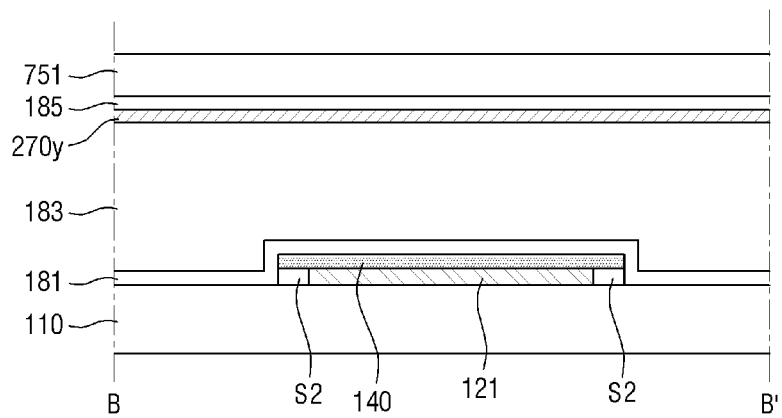
Figure 65:
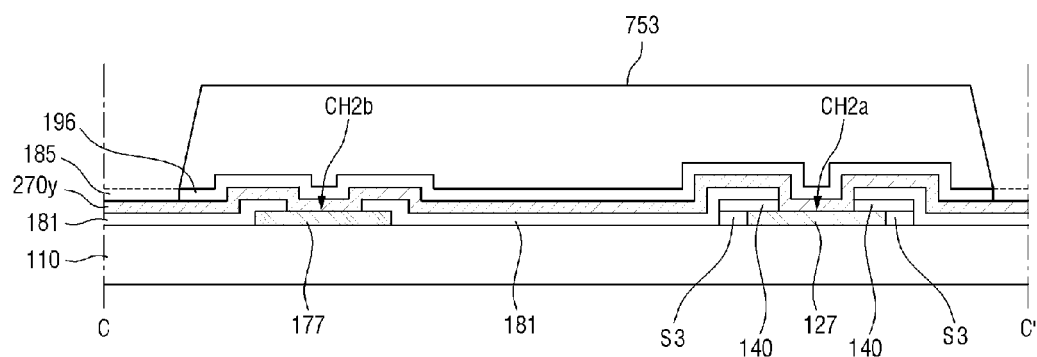
Figure 66:
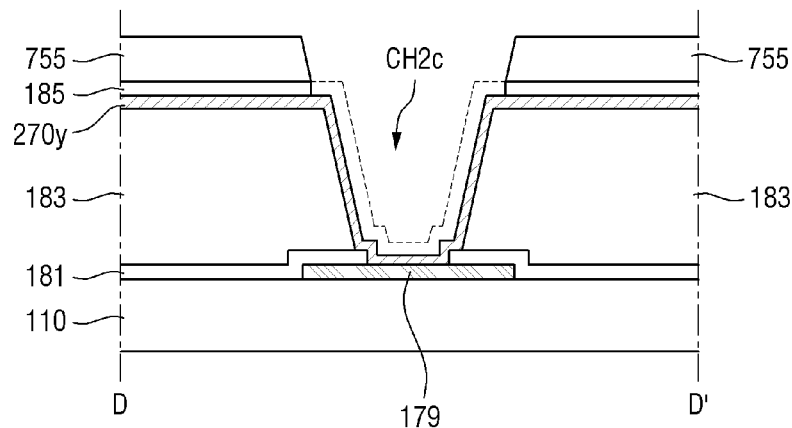
Figure 67:
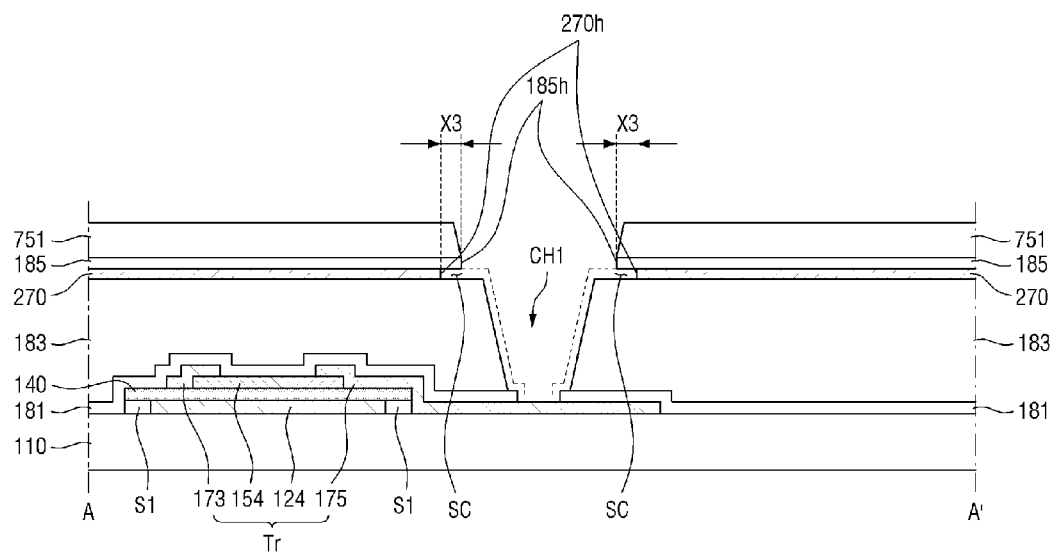
Figure 68:
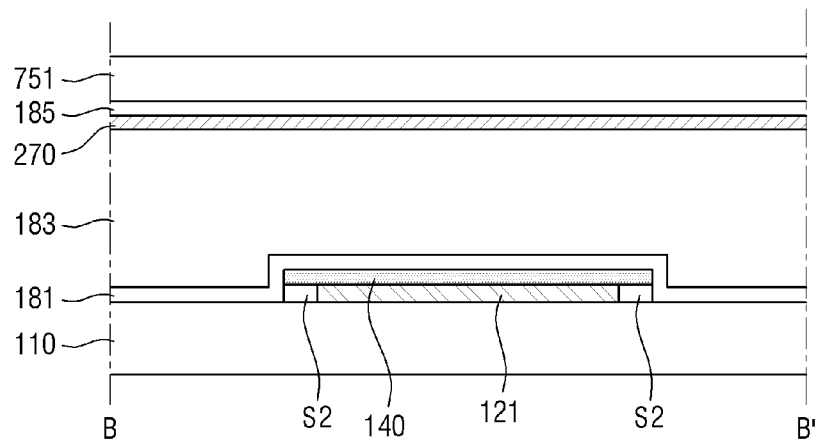
Figure 69:
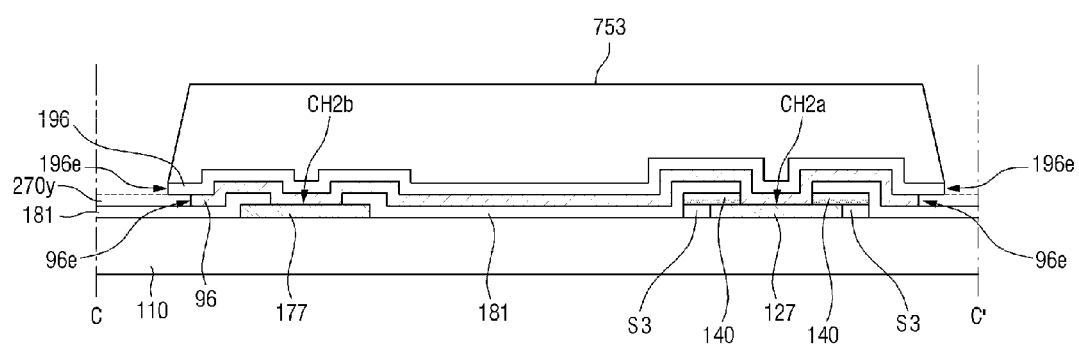
Figure 70:
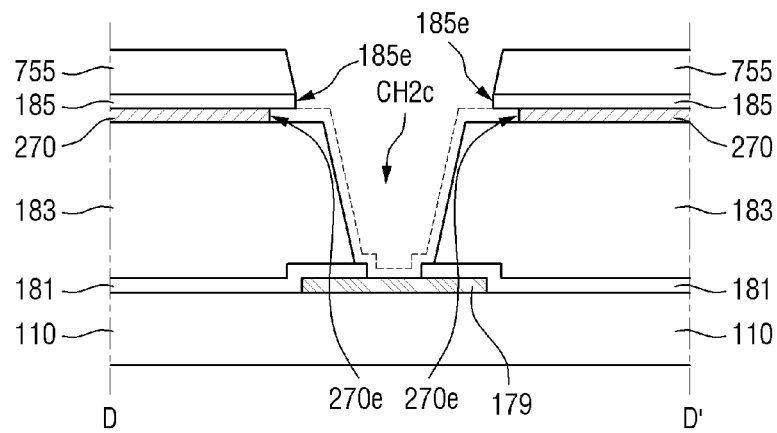
Figure 71:
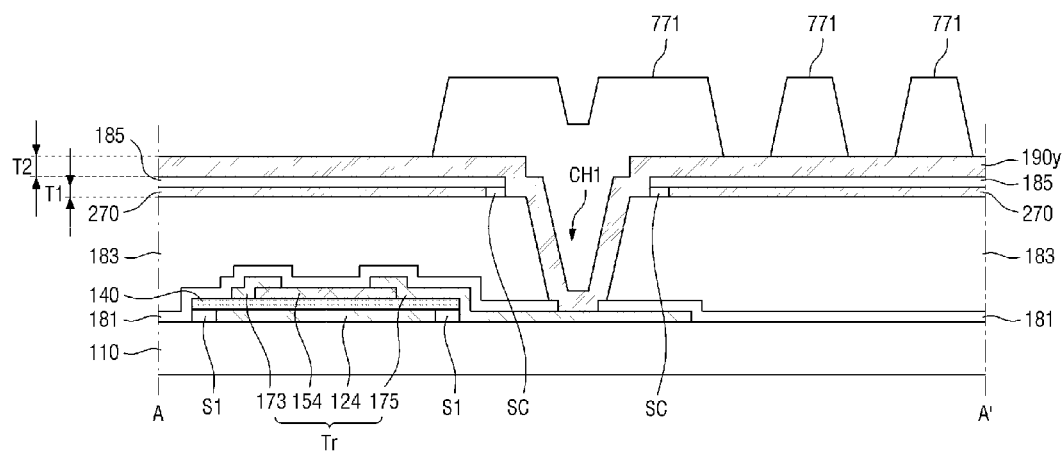
Figure 72:
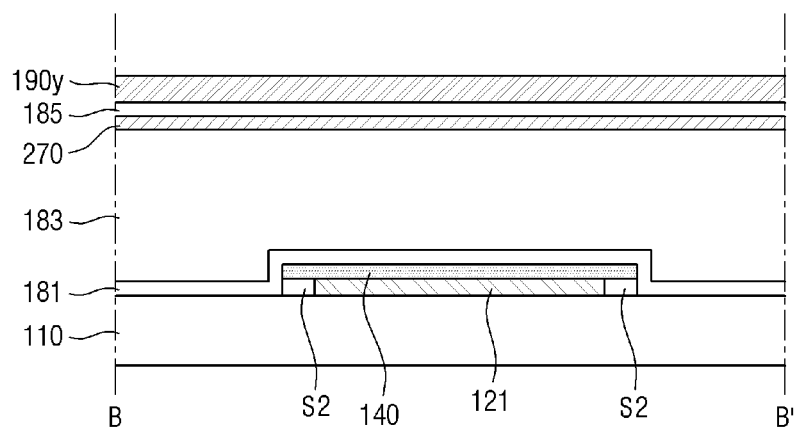
Figure 73:
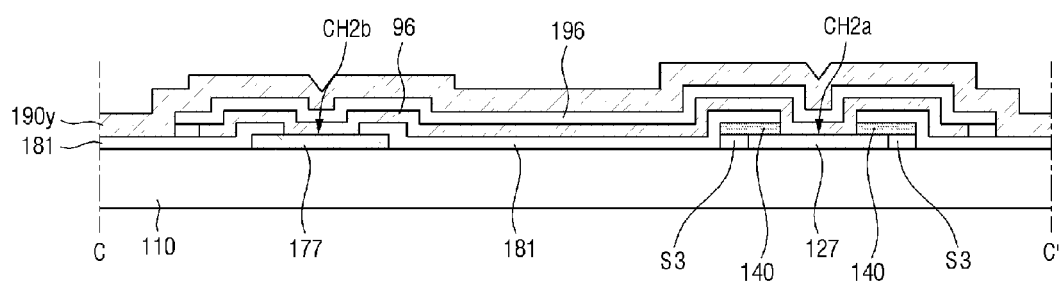
Figure 74:
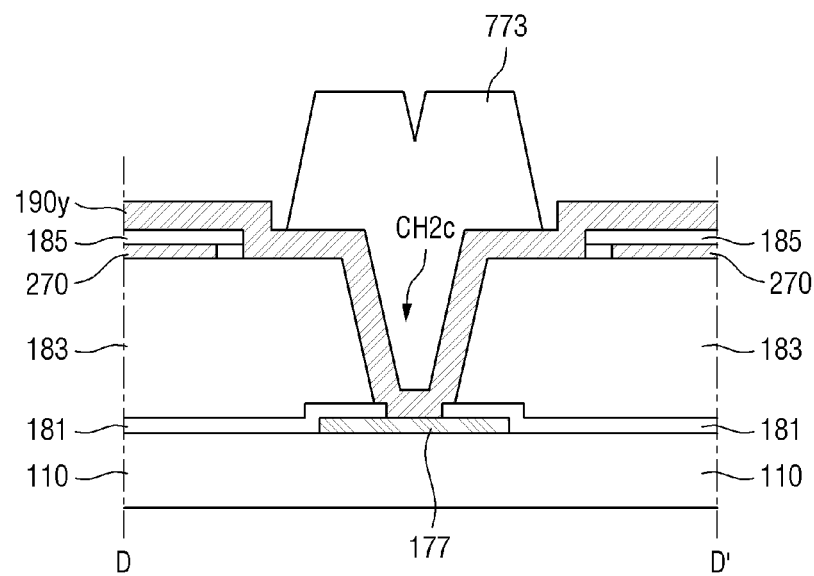
Figure 75:
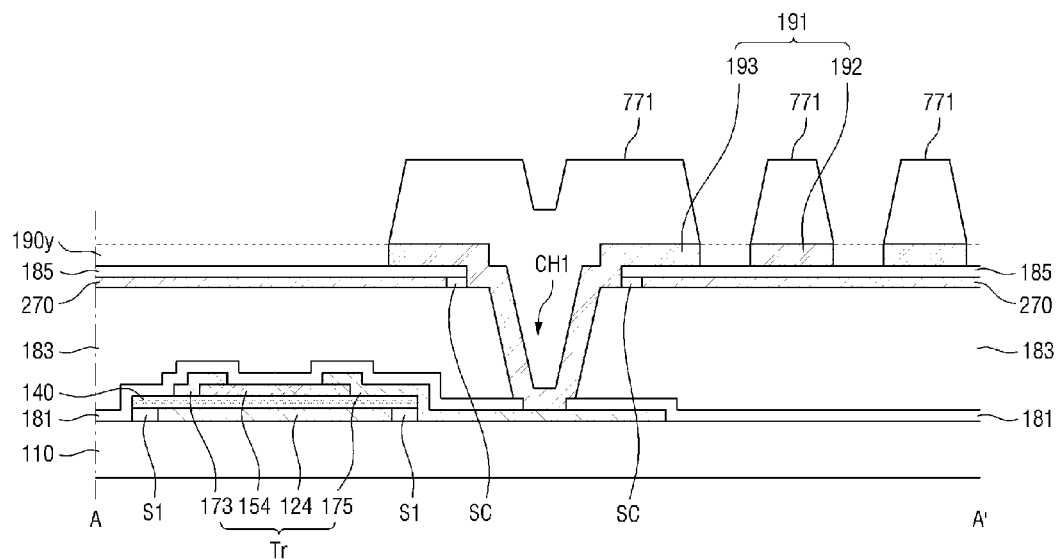
Figure 76:
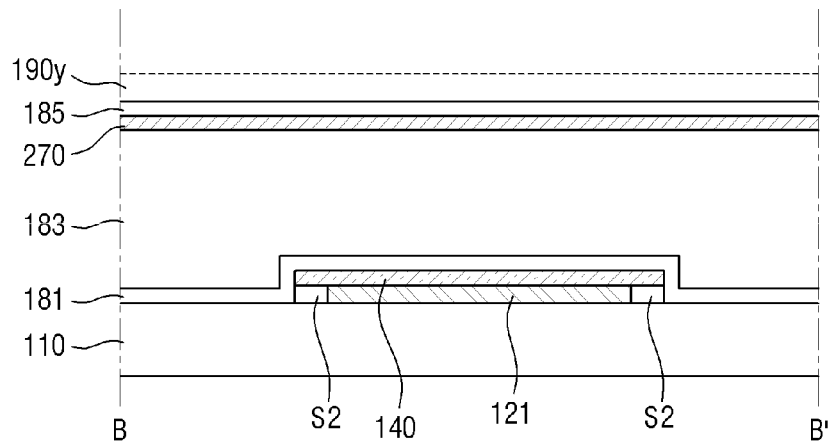
Figure 77:
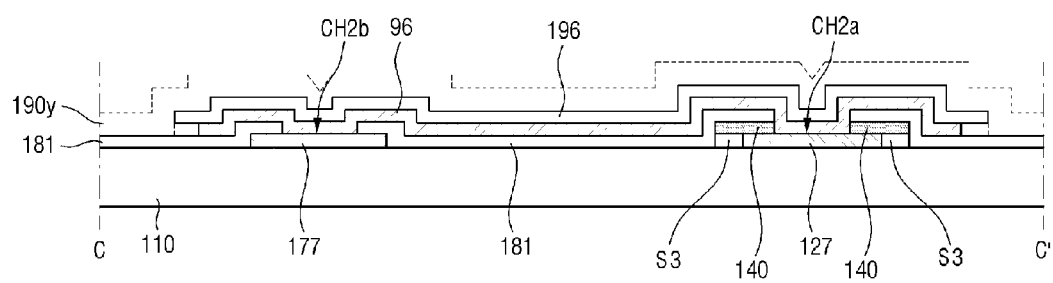
Figure 78:
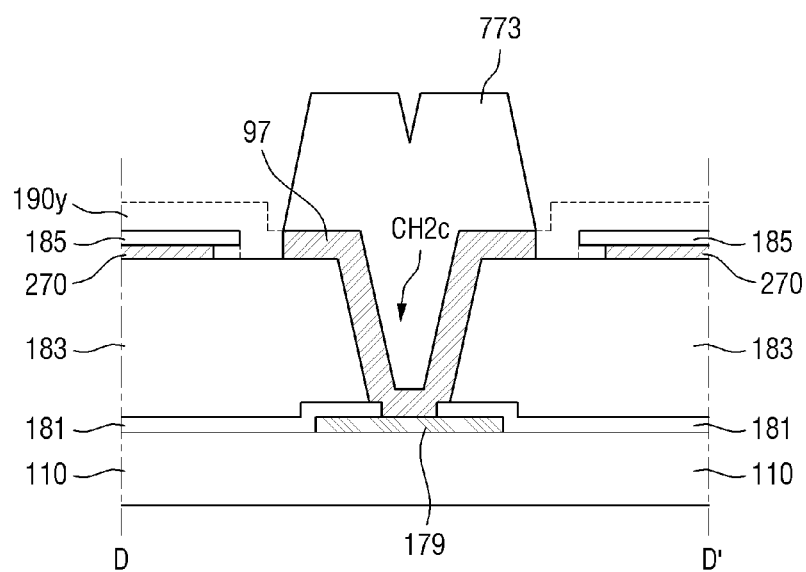

Referring to FIGS. 39 through 41, a second conductive layer 170y is formed on the entire surface of the first base 110 to cover the gate insulating layer 140 and the semiconductor pattern 154. The second conductive layer 170y may be formed of Al, Cu, Ag, Mo, Cr, Ti, Ta, or an alloy thereof and may have a multilayer structure consisting of a lower layer (not illustrated) formed of a refractory metal and a low-resistance upper layer formed on the lower layer, but the present disclosure is not limited thereto.

As mentioned above, the spaces (S1, S2, and S3) are provided around the gate conductor (121, 124, and 127), and the edges 140e of the gate insulating layer 140 project further than the edges of the gate conductor (121, 124, and 127). Thus, the second conductive layer 170y is not connected to the gate conductor (121, 124, and 127).

Thereafter, a second photosensitive layer is formed on the second conductive layer 170y and is then subjected to exposure and development using a photomask, thereby forming a fifth photosensitive layer pattern 731, a sixth photosensitive layer pattern 733, and a seventh photosensitive layer pattern 735.

The fifth photosensitive layer pattern 731 may include a first portion 731a, which corresponds to an area where a source electrode and a data line are to be formed, and a second portion 731b, which corresponds to an area where a drain electrode is to be formed. The sixth photosensitive layer pattern 733 is formed in an area corresponding to a gate signal transmission pad portion, and the seventh photosensitive layer pattern 735 is formed in an area corresponding to a data pad portion.

Thereafter, referring to FIGS. 43 through 46, the second conductive layer 170y is etched using the fifth photosensitive layer pattern 731, the sixth photosensitive layer pattern 733, and the seventh photosensitive layer pattern 735 as an etching mask. Thereafter, the fifth photosensitive layer pattern 731, the sixth photosensitive layer pattern 733, and the seventh photosensitive layer pattern 735 are removed. As a result, the TFT Tr including the source electrode 173 and the drain electrode 175 and the data line 171 are formed below the fifth photosensitive layer pattern 731, the gate signal transmission pad portion 177 is formed below the sixth photosensitive layer pattern 733, and the data pad portion 179 is formed below the seventh photosensitive layer pattern 735.

Thereafter, referring to FIGS. 47 through 50, an insulating material is applied onto the entire surface of the first base 110, thereby forming the first passivation layer 181. Thereafter, a photosensitive organic material layer is formed on the first passivation layer 181 and is then subjected to exposure and development using a photomask such as a multi-tone mask (for example, a halftone mask), thereby forming a first organic material layer 83a having a fourth thickness Hd and a second organic material layer 83b having a fifth thickness He, which is smaller than the fourth thickness Hd. The first organic material layer 83a may be formed in an area corresponding to the display area and in the area corresponding to the data pad portion 179. The second organic material layer 83b may be formed in areas where the gate pad portion 127 and the gate signal transmission pad portion 177 are provided.

A first opening C1, which corresponds to an area where a contact hole is to be formed, and a fourth opening C2c, which corresponds to an area where a third pad contact hole is to be formed, are formed in the first organic material layer 83a, and a second opening C2a, which corresponds to an area where a first pad contact hole is to be formed, and a third opening C2b, which corresponds to an area where a second pad contact hole is to be formed, are formed in the second organic material layer 83b.

Thereafter, referring to FIGS. 51 through 54, the first passivation layer 181 and the gate insulating layer 140 are etched using the first organic material layer 83a and the second organic material layer 83b as an etching mask. As a result, the contact hole CH1, which exposes part of the drain electrode 175, the second pad contact hole CH2b, which exposes part of the gate signal transmission pad portion 177, and the third pad contact hole CH2c, which exposes part of the data pad portion 179, are formed in the first passivation layer 181. Also, the first pad contact hole CH2a, which exposes part of the gate pad portion 127, is formed in the gate insulating layer 140 and the first passivation layer 181.

Thereafter, referring to FIGS. 55 through 58, the second organic material layer 83b is removed using an ashing process. During the removal of the second organic material layer 83b, part of the first organic material layer 83a may also be removed. As mentioned above, the fourth thickness Hd of the first organic material layer 83a is larger than the fifth thickness He of the second organic material layer 83b. Accordingly, during the removal of the second organic material layer 83b, the first organic material layer 83a having the fourth thickness Hd may be thinned, and as a result, the organic layer 183 having a sixth thickness Hf, which is smaller than the fourth thickness Hd, may be formed.

FIGS. 59 through 78 are cross-sectional views further illustrating the method of fabricating the display device according to the exemplary embodiment of FIG. 1, particularly, steps that follow the steps illustrated in FIGS. 55 through 58.

Referring to FIGS. 59 through 62, a third conductive layer 270y is formed on the entire surface of the first base 110 and the organic layer 183 using a transparent conductive material, and the second passivation layer 185 is formed on the third conductive layer 270y. At least part of the third conductive layer 270y may be disposed in the contact hole CH1, the first pad contact hole CH2a, the second pad contact hole CH2b, and the third pad contact hole CH2c, respectively.

Thereafter, a third photosensitive layer is formed on the second passivation layer 185 and is then subjected to exposure and development using a photomask, thereby forming an eighth photosensitive layer pattern 751, a ninth photosensitive layer pattern 753, and a tenth photosensitive layer pattern 755.

The eighth photosensitive layer pattern 751 is formed in the area corresponding to the display area, but not in the area corresponding to the contact hole CH1. In other words, the eighth photosensitive layer pattern 751 may not be formed in an area where an electrode opening is to be formed and an area where a passivation opening is to be formed. The ninth photosensitive layer pattern 753 may be formed in an area where a connecting member is to be formed. The tenth photosensitive layer pattern 755 is formed in and around the area corresponding to the data pad portion 179, but not in an area corresponding to the third pad contact hole CH2c. In other words, the tenth photosensitive layer pattern 755 may not be formed in an area where a contact assisting member is to be formed.

Thereafter, referring to FIGS. 63 through 66, the second passivation layer 185 is dry-etched using the eighth photosensitive layer pattern 751, the ninth photosensitive layer pattern 753, and the tenth photosensitive layer pattern 755 as an etching mask. As a result, the passivation opening 185h of the second passivation layer 185 may be formed around the contact hole CH1 not covered by the eighth photosensitive layer pattern 751, and the passivation pattern 196 may be formed on the gate pad portion 127 and the gate signal transmission pad portion 177 both covered by the ninth photosensitive layer pattern 753. Similarly, part of the second passivation layer 185 not covered by the tenth photosensitive layer pattern 755, i.e., part of the second passivation layer 185 around the third pad contact hole CH2c, may be removed.

Thereafter, referring to FIGS. 67 through 70, the third conductive layer 270y is over-etched through wet etching using the eighth photosensitive layer pattern 751, the ninth photosensitive layer pattern 753, and the tenth photosensitive layer pattern 755 as an etching mask, thereby forming the first electrode 270 and the connecting member 96. Thereafter, the eighth photosensitive layer pattern 751, the ninth photosensitive layer pattern 753, and the tenth photosensitive layer pattern 755 are removed.

Part of the third conductive layer 270y covered by the eighth photosensitive layer pattern 751 becomes the first electrode 270, and the electrode opening 270h is formed in part of the third conductive layer 270y not covered by the eighth photosensitive layer pattern 751 around the contact hole CH1. The connecting member 96 is formed in part of the third conductive layer 270y covered by the ninth photosensitive layer pattern 753. Part of the third conductive layer 270y not covered by the tenth photosensitive layer pattern 753 around the third pad contact hole CH2c is removed.

As a result of the over-etching of the third conductive layer 270y, the edges 270e of the first electrode 270 may be located more inwardly than the edges 185e of the second passivation layer 185 by as much as a third distance X3. Similarly, the edges 96e of the connecting member 96 may be located more inwardly than the edges 196e of the passivation pattern 196, and the distance between the edges 96e of the connecting member 96 and the edges 196e of the passivation pattern 196 may be the third distance X3. Also, as a result of the over-etching of the third conductive layer 270y, the size and width of the electrode opening 270h of the first electrode 270 may be larger than the size and width of the passivation opening 185h of the second passivation layer 185, and a space SC may be formed around the electrode opening 270h.

Thereafter, referring to FIGS. 71 through 74, a fourth conductive layer 190y is formed on the second passivation layer 185 and the entire surface of the first base 110 using a transparent conductive material. Part of the fourth conductive layer 190y may be disposed in the contact hole CH1 and may thus contact the drain electrode 175, and part of the fourth conductive layer 190y may be disposed in the third pad contact hole CH2c and may thus contact the data pad portion 179. The second thickness T2 of the fourth conductive layer 190y may be larger than the first thickness T1 of the first electrode 270. The second thickness T2 may be about two times larger than the first thickness T1. Accordingly, the fourth conductive layer 190y may be prevented from being disconnected due to the difference in height between the electrode opening 270h of the first electrode 270 and the passivation opening 185h of the second passivation layer 185.

The size and width of the electrode opening 270h of the first electrode 270 may be larger than the size and width of the passivation opening 185h of the second passivation layer 185. The edges 185e of the second passivation layer 185 may project further than the edges 270e of the first electrode 270. Thus, the fourth conductive layer 190y, which is disposed on the second passivation layer 185, may not be connected to the first electrode 270, which is formed below the second passivation layer 185. That is, the first electrode 270 and the fourth conductive layer 190y may be spaced apart from each other with the contact hole CH1 provided therebetween and may not be connected to each other.

Thereafter, a fourth photosensitive layer is formed on the fourth conductive layer 190y and is then subjected to exposure and development using a photomask, thereby forming an eleventh photosensitive layer pattern 771 and a twelfth photosensitive layer pattern 773. The eleventh photosensitive layer pattern 771 may be formed in an area corresponding to a second electrode, and the twelfth photosensitive layer pattern 773 may be formed in an area corresponding to a contact assisting member.

Thereafter, referring to FIGS. 75 through 78, the second electrode 191 and the contact assisting member 97 are formed by etching the fourth conductive layer 190y using the eleventh photosensitive layer pattern 771 and the twelfth photosensitive layer pattern 773 as an etching mask. Thereafter, the eleventh photosensitive layer pattern 771 and the twelfth photosensitive layer pattern 773 are removed, thereby obtaining the first display substrate 10 of FIGS. 1 through 5.

Thereafter, the second display substrate 20 is formed, and the liquid crystal layer 30 is injected between the first display substrate 10 and the second display substrate 20, thereby obtaining the display device 1 of FIGS. 1 through 5.

Figure 79:
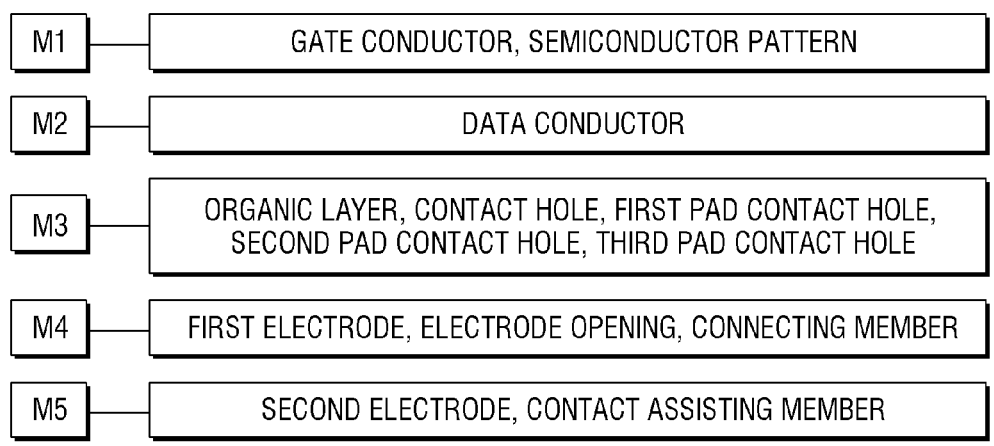
FIG. 79 is a schematic view showing photomasks for use in the fabrication of the display device according to the exemplary embodiment of FIG. 1 and elements formed using the photomask.

FIG. 79 is a diagram showing the use of particular photomasks in the fabrication of the display device according to the exemplary embodiment of FIG. 1 and elements formed using the photomask.

Referring to FIGS. 1 and 79, during the fabrication of the display device 1, a photomask M1 is used for forming the gate conductor (121, 124, and 127) and the semiconductor pattern 154, a photomask M2 is used for forming the data conductor (171, 173, 175, 177, and 179). Also, the organic layer 183, the contact hole CH1, the first pad contact hole CH2a, the second pad contact hole CH2b, and the third pad contact hole CH2c are formed using a photomask M3. Also, the first electrode 270, the electrode opening 270h of the first electrode 270, and the connecting member 96 are formed using a photomask M4, and the second electrode 191 and the contact assisting member 97 are formed using a photomask M5.

That is, the display device 1 may be fabricated using a total of five photomasks, and thus, an increase in the manufacturing cost of the display device 1 may be prevented.

In addition, since the entire semiconductor pattern 154 is formed on the gate conductor (121, 124, and 127), light provided by a backlight unit may be prevented from being introduced into the semiconductor pattern 154, and thus, a leakage current may be prevented from being generated in the TFT Tr.

Moreover, the second electrode 191 and the first electrode 270 may be prevented from being connected to each other, and the second electrode 191 may be prevented from being disconnected in part of the display device 1 where a height difference exists.

However, the effects of the inventive concept are not restricted to the one set forth herein. The above and other effects of the inventive concept will become more apparent to one of daily skill in the art to which the inventive concept pertains by referencing the claims.

While the inventive concept has been particularly shown and described with reference to exemplary embodiments thereof, it will be understood by those of ordinary skill in the art that various changes in form and detail may be made therein without departing from the spirit and scope of the inventive concept as defined by the following claims. The exemplary embodiments should be considered in a descriptive sense only and not for purposes of limitation.

What is claimed is:

1. A display device, comprising:
a base;
a gate conductor disposed directly on the base and including a gate line and a gate electrode;
a gate insulating layer disposed on the gate conductor and including an overlap portion, which overlaps with the gate conductor, and a non-overlap portion, which is connected to the overlap portion, does not overlap with the gate conductor, and is spaced apart from the base with a space provided between the gate insulating layer and the base; and
a semiconductor pattern disposed on the gate insulating layer and overlapping with the gate electrode,
wherein each of a plurality of edges of the gate insulating layer projects further than at least one of a plurality of edges of the gate conductor and at least one of a plurality of edges of the semiconductor pattern.

2. The display device of claim 1, wherein a shape of each of the plurality of edges of the gate insulating layer is the same as a shape of the at least one of the plurality of edges of the gate conductor.

3. The display device of claim 1, wherein each of the plurality of edges of the gate conductor project further than the at least one of the plurality of edges of the semiconductor pattern.

4. The display device of claim 3, wherein a shape of each of the plurality of edges of the semiconductor pattern is the same as a shape of at least one of the plurality of edges of the gate electrode.

5. The display device of claim 3, wherein the semiconductor pattern is isolated from other portions of a layer that the semiconductor pattern is disposed in.

6. The display device of claim 1, wherein the semiconductor pattern overlaps with the gate conductor, and
wherein the gate insulating layer does not contact the base.

7. A display device, comprising:
a base;
a gate conductor disposed directly on the base and including a gate line and a gate electrode;
a gate insulating layer disposed on the gate conductor and including an overlap portion, which overlaps with the gate conductor, and a non-overlap portion, which is connected to the overlap portion, does not overlap with the gate conductor, and is spaced apart from the base;
a semiconductor pattern disposed on the gate insulating layer and overlapping with the gate electrode; and
a data conductor disposed on the base and including a data line, which is insulated from the gate line, a source electrode, which is connected to the data line and the semiconductor pattern, and a drain electrode, which is connected to the semiconductor pattern and is spaced apart from the source electrode,
wherein the drain electrode includes a first portion, which is disposed on the base, does not overlap with the gate insulating layer, and is spaced apart from the gate electrode with a space provided therebetween, and a second portion, which is connected to the first portion and is disposed on the gate insulating layer
wherein each of the plurality of edges of the gate insulating layer projects further than at least one of a plurality of edges of the gate conductor and at least one of a plurality of edges of the semiconductor pattern.

8. The display device of claim 7, wherein the first portion is disposed directly on the base.

9. The display device of claim 7, wherein the second portion includes a first sub-portion, which overlaps with the non-overlap portion and does not overlap with the gate electrode and the semiconductor pattern, and a second sub-portion, which is connected to the first sub-portion, overlaps with the overlap portion and the gate electrode, and does not overlap with the semiconductor pattern.

10. The display device of claim 9, wherein the second portion further includes a third sub-portion, which is connected to the second sub-portion and overlaps with the gate electrode, the overlap portion, and the semiconductor pattern.

11. The display device of claim 7, further comprising:
a first passivation layer disposed on the source electrode, the drain electrode, and the semiconductor pattern;
a first electrode disposed on the first passivation layer;
a second passivation layer disposed on the first electrode; and
a second electrode disposed on the second passivation layer.

12. The display device of claim 11, wherein a thickness of the second electrode is larger than a thickness of the first electrode.

13. The display device of claim 11, wherein:
the first passivation layer includes a contact hole, which exposes a part of the drain electrode;
the first electrode includes an electrode opening, which overlaps with the contact hole;
the second passivation layer includes a passivation opening, which overlaps with the electrode opening;

the second electrode is connected to the drain electrode through the contact hole, the electrode opening, and the passivation opening; and a size of the passivation opening is smaller than a size of the electrode opening.

14. The display device of claim 13, further comprising:
an organic layer disposed between the first passivation layer and the second passivation layer,
wherein:
the first electrode is disposed on the organic layer; and
the contact hole is formed in the first passivation layer and the organic layer.

15. The display device of claim 11, wherein:
the data conductor further includes a gate signal transmission pad portion, which is disposed on the base;
the gate conductor further includes a gate pad portion, which is disposed directly on the base and is connected to the gate line; and
the gate signal transmission pad portion and the gate pad portion are electrically connected via a connecting member.

16. The display device of claim 15, wherein:
each of the gate insulating layer and the first passivation layer include a first pad contact hole, which exposes the gate pad portion;
the first passivation layer includes a second pad contact hole, which exposes the gate signal transmission pad portion; and
the connecting member is connected to the gate pad portion via the first pad contact hole and is connected to the gate signal transmission pad portion via the second pad contact hole.

17. The display device of claim 15, wherein the connecting member comprises a same material as the first electrode.

18. The display device of claim 17, further comprising:
an insulating member disposed on the connecting member and comprising a same material as the second passivation layer,
wherein each of a plurality of edges of the insulating member projects further than at least one of a plurality of edges of the connecting member.

19. The display device of claim 11, wherein:
the data conductor further includes a data pad portion, which is disposed on the base and is connected to the data line;
the first passivation layer includes a third pad contact hole, which exposes the data pad portion; and
a contact assisting member, which is connected to the data pad portion, is disposed on the first passivation layer.

20. The display device of claim 19, wherein the contact assisting member comprises a same material as the second electrode.

21. A display device, comprising:
a base;
a gate electrode disposed directly on the base;
a gate insulating layer disposed on the gate electrode;
a semiconductor pattern disposed on the gate insulating layer and overlapping with the gate electrode;
a source electrode connected to the semiconductor pattern; and
a drain electrode connected to the semiconductor pattern and spaced apart from the source electrode and the gate electrode,
wherein the drain electrode includes a first portion, which is disposed on the base, does not overlap with the gate insulating layer, and is spaced apart from the gate electrode with a space provided therebetween, and a second portion, which is connected to the first portion and is disposed on the gate insulating layer.

22. The display device of claim 21, wherein the first portion is disposed directly on the base.

23. The display device of claim 21, wherein the gate insulating layer comprises a non-overlap portion and an overlap portion connected to the non-overlap portion, wherein the second portion includes a first sub-portion, which overlaps with the non-overlap portion and does not overlap with the gate electrode and the semiconductor pattern, and a second sub-portion, which is connected to the first sub-portion, overlaps with the overlap portion and the gate electrode, and does not overlap with the semiconductor pattern.

24. The display device of claim 23, wherein the second portion further includes a third sub-portion, which is connected to the second sub-portion and overlaps with the gate electrode, the overlap portion, and the semiconductor pattern.

25. The display device of claim 21, wherein each of a plurality of edges of the gate electrode project further than at least one of a plurality of edges of the semiconductor pattern.

26. The display device of claim 25, wherein a shape of each of the plurality of edges of the semiconductor pattern is the same as a shape of at least one of the plurality of edges of the gate electrode.

27. The display device of claim 25, wherein the semiconductor pattern is isolated from other portions of a layer that the semiconductor pattern is disposed in.

28. The display device of claim 21, wherein the semiconductor pattern overlaps with the gate electrode.

* * * * *